(12) United States Patent
Male et al.

(10) Patent No.: US 11,538,771 B2
(45) Date of Patent: Dec. 27, 2022

(54) INTEGRATED CIRCUIT WITH AN EMBEDDED INDUCTOR OR TRANSFORMER

(71) Applicant: Texas Instruments Incorporated, Dallas, TX (US)

(72) Inventors: Barry Jon Male, West Granby, CT (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/985,052

(22) Filed: Aug. 4, 2020

(65) Prior Publication Data

US 2020/0365532 A1    Nov. 19, 2020

Related U.S. Application Data

(63) Continuation of application No. 15/678,841, filed on Aug. 16, 2017, now Pat. No. 10,734,331.

(51) Int. Cl.
*H01L 23/64* (2006.01)
*H01F 17/00* (2006.01)
(Continued)

(52) U.S. Cl.
CPC ....... *H01L 23/645* (2013.01); *H01F 17/0006* (2013.01); *H01F 17/0013* (2013.01); *H01F 27/24* (2013.01); *H01F 27/2804* (2013.01); *H01F 41/046* (2013.01); *H01L 23/4952* (2013.01); *H01L 23/49513* (2013.01); *H01L 23/49575* (2013.01); *H01L 23/5227* (2013.01); *H01L 23/66* (2013.01); *H01L 28/10* (2013.01); *H01F 2017/0073* (2013.01); *H01F 2017/0086* (2013.01); *H01F 2027/2809* (2013.01); *H01L 2223/6655* (2013.01);
(Continued)

(58) Field of Classification Search
CPC . H01L 23/66; H01L 23/645; H01L 23/49513; H01L 23/4952; H01L 23/5227; H01L 28/10
See application file for complete search history.

(56) References Cited

U.S. PATENT DOCUMENTS 5,519,582 A * 5/1996 Matsuzaki ............ H01L 23/645
                                                      336/208
6,002,161 A   12/1999 Yamazaki
(Continued)

*Primary Examiner* — Peniel M Gumedzoe
(74) *Attorney, Agent, or Firm* — Dawn Jos; Frank D. Cimino

(57) ABSTRACT

In a described example, an integrated circuit includes: a semiconductor substrate having a first surface and an opposite second surface; at least one dielectric layer overlying the first surface of the semiconductor substrate; at least one inductor coil in the at least one dielectric layer with a plurality of coil windings separated by coil spaces, the at least one inductor coil lying in a plane oriented in a first direction parallel to the first surface of the semiconductor substrate, the at least one inductor coil electrically isolated from the semiconductor substrate by a portion of the at least one dielectric layer; and trenches extending into the semiconductor substrate in a second direction at an angle with respect to the first direction, the trenches underlying the inductor coil and filled with dielectric replacement material.

17 Claims, 17 Drawing Sheets

(51) Int. Cl.
*H01F 27/24* (2006.01)
*H01F 27/28* (2006.01)
*H01F 41/04* (2006.01)
*H01L 23/495* (2006.01)
*H01L 23/522* (2006.01)
*H01L 23/66* (2006.01)
*H01L 49/02* (2006.01)

(52) U.S. Cl.
CPC ............... *H01L 2224/32145* (2013.01); *H01L 2224/32245* (2013.01); *H01L 2224/48091* (2013.01); *H01L 2224/48465* (2013.01); *H01L 2224/73265* (2013.01)

(56) References Cited

U.S. PATENT DOCUMENTS

| | | |
|---|---|---|
| 9,419,075 B1 | 8/2016 | Carothers et al. |
| 2004/0056749 A1 | 3/2004 | Kahlmann et al. |
| 2006/0157798 A1 | 7/2006 | Hayashi et al. |
| 2006/0192286 A1 | 8/2006 | Kanamura |
| 2007/0042609 A1 | 2/2007 | Senkevich et al. |
| 2011/0176339 A1* | 7/2011 | Kerber ................ H01L 23/5227 257/773 |
| 2012/0256290 A1* | 10/2012 | Renna ................ H01L 25/0657 438/118 |
| 2013/0321094 A1 | 12/2013 | Sumida et al. |
| 2014/0159196 A1 | 6/2014 | Mackh et al. |
| 2014/0327107 A1 | 11/2014 | Padmanathan et al. |
| 2014/0374890 A1 | 12/2014 | Yamashita et al. |

\* cited by examiner

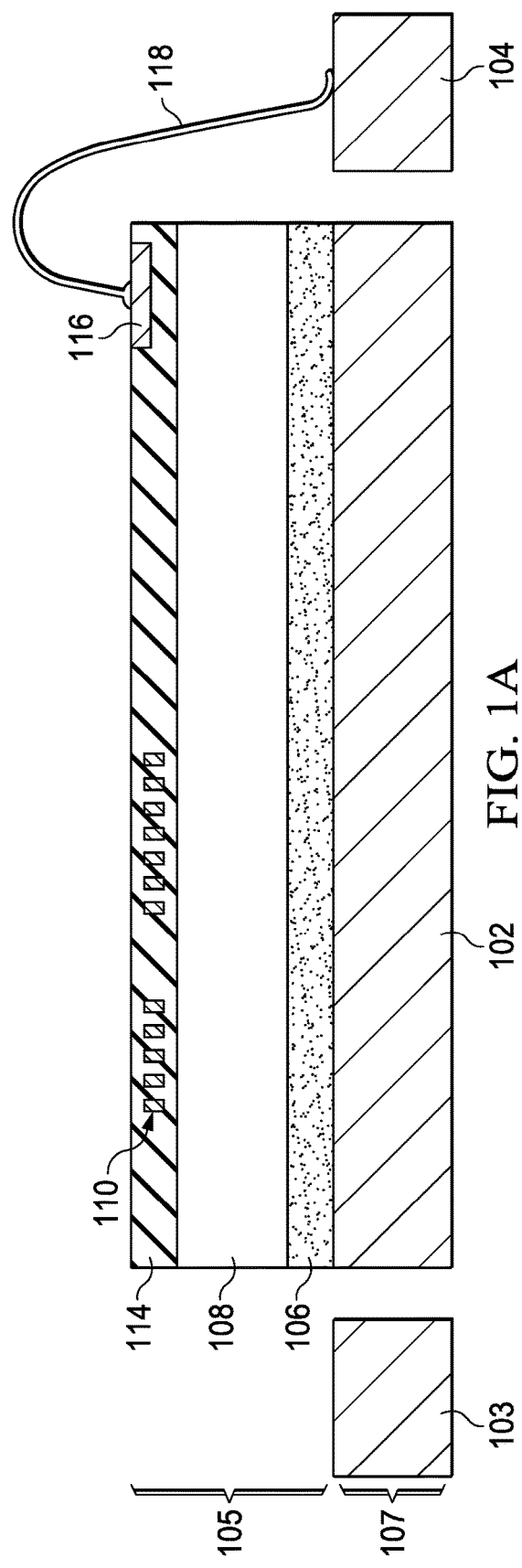
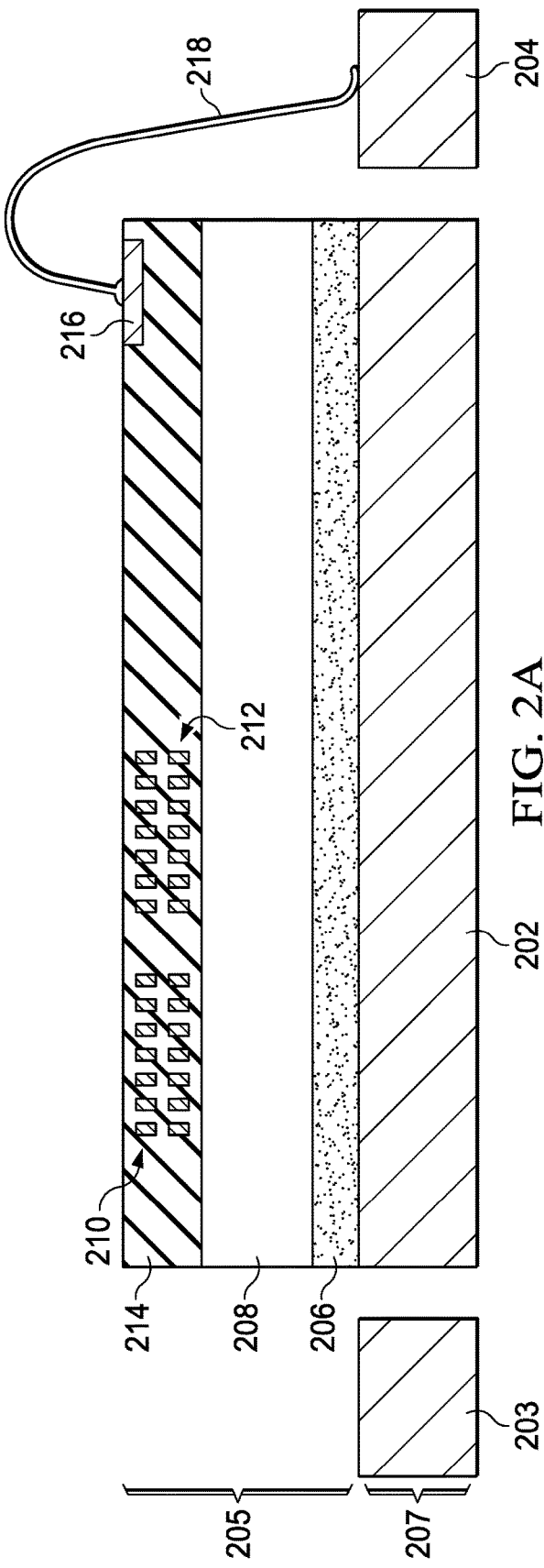
FIG. 1A
FIG. 2A

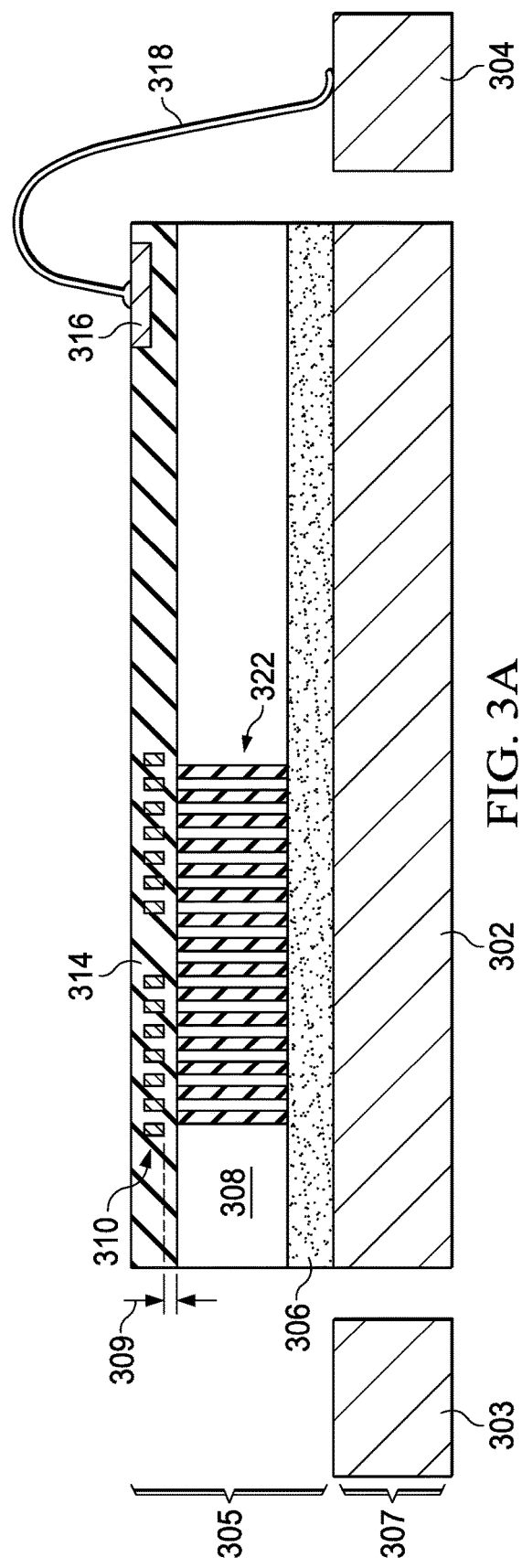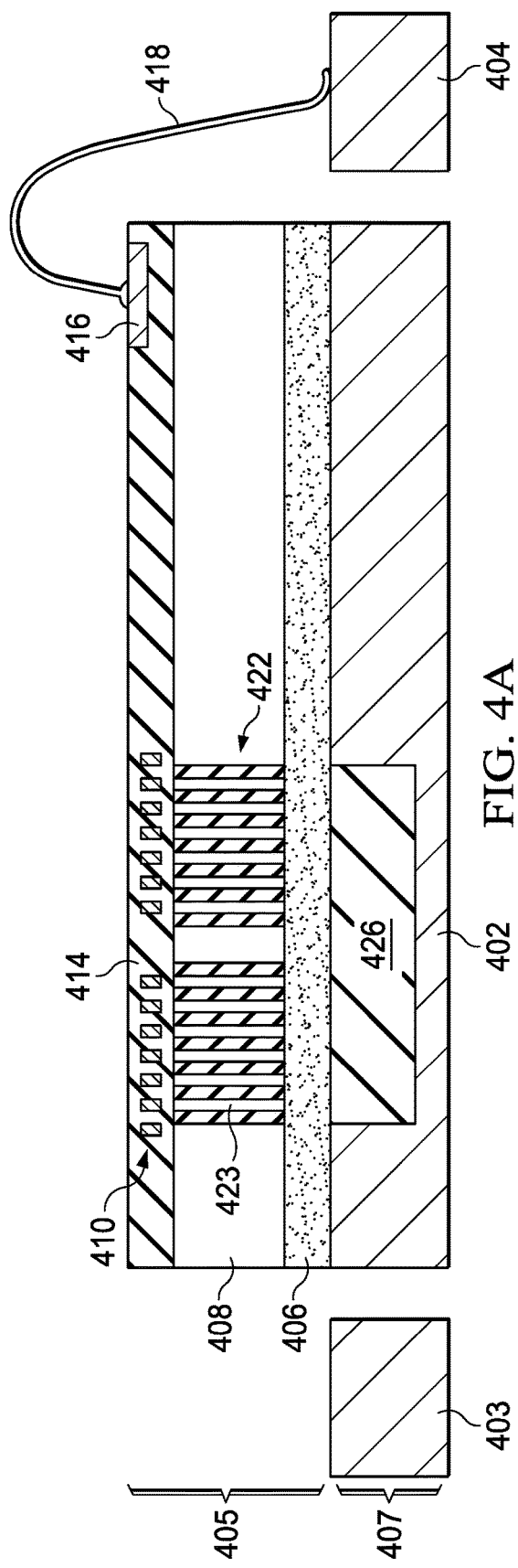

INTEGRATED CIRCUIT WITH AN EMBEDDED INDUCTOR OR TRANSFORMER

This application is a continuation of U.S. patent application Ser. No. 15/678,841, filed Aug. 16, 2017, the contents of which are herein incorporated by reference in its entirety.

TECHNICAL FIELD

This disclosure relates generally to integrated circuits, and more particularly to integrated circuits with embedded inductor coils and/or transformer coils.

BACKGROUND

Wireless devices such as cell phones, tablets, and laptops require integrated circuits that operate at radio frequencies (RFICs). Embedded inductor coils are used in RFICs such as voltage controlled oscillators, low noise amplifiers, power amplifiers, mixers, filters and matching networks. Embedded transformers are used for power converters, to pass signals from a first integrated circuit or sub-circuit that operates at one voltage to a second integrated circuit or sub-circuit that operates at a different voltage, and to electrically isolate two integrated circuits that operate at the same voltage.

On-chip embedded inductors and transformers in commercially available planar semiconductor processes exhibit a low quality factor (Q), due to energy losses. The energy losses occur as the result of the coupling between the inductor coils and transformer coils and the underlying low resistance silicon substrate. Q is given by Equation 1:

$$Q = 2\pi \frac{\text{peak magnetic energy} - \text{peak electronic energy}}{\text{energy dissipated per cycle of oscillation}} \quad (1)$$

When current flows through the windings of an embedded inductor coil or an embedded transformer coil, the magnetic fields induced around the coil extend into the underlying semiconductor substrate to a depth that is proportional to size of the embedded inductor or transformer coil. The silicon substrate is conductive and the time varying magnetic field induces an electric field (E) in the substrate. The electric field induces a parasitic eddy current in the substrate. The parasitic eddy current flows in a direction opposing the current flowing in the embedded inductor coil or transformer coil. The parasitic eddy current acts similar to a current due to a shorted secondary winding in a parasitic transformer and can reduce the Q for the coil by 50% or more. The reduction in Q results in reduced power transfer efficiency and limits the frequency of operation.

SUMMARY

In a described example, an integrated circuit with an inductor coil embedded in an inter-metal dielectric (IMD) includes trenches filled with a replacement dielectric in the portion of a semiconductor substrate underlying the embedded inductor coil. The trenches extend from a first surface of the semiconductor substrate into the semiconductor substrate. In an example the trenches extend to a second surface of the semiconductor substrate opposite the first surface. In a described example, an integrated circuit (IC) with an inductor coil embedded in the IMD includes a semiconductor substrate with a substrate coil underlying the embedded inductor coil with a trench filled with a replacement dielectric. In one example the substrate coil is the same size and has the same number of coil windings as the embedded inductor coil. In a described example, a transformer is formed with a first IC with a first inductor coil embedded in IMD and a second IC with a second inductor coil embedded in IMD by inverting the second IC and bonding it to a first surface of the first IC with the second inductor coil aligned to the first inductor coil. In another example, a method forms an integrated circuit with embedded transformer coils and with a trench filled with replacement dielectric.

BRIEF DESCRIPTION OF THE DRAWINGS

FIG. 1A is a cross section of an integrated circuit with an embedded inductor coil.

FIG. 2A is a cross section of an integrated circuit with embedded transformer coils and FIG. 2B is a top down view of the integrated circuit and embedded transformer coils.

FIG. 3A is a cross section of another integrated circuit with an embedded inductor coil and with underlying trenches filled with replacement dielectric.

FIG. 4A is a cross section of an integrated circuit with an embedded inductor coil and with a substrate inductor coil underlying the embedded inductor coil.

DETAILED DESCRIPTION

Figure 1B:
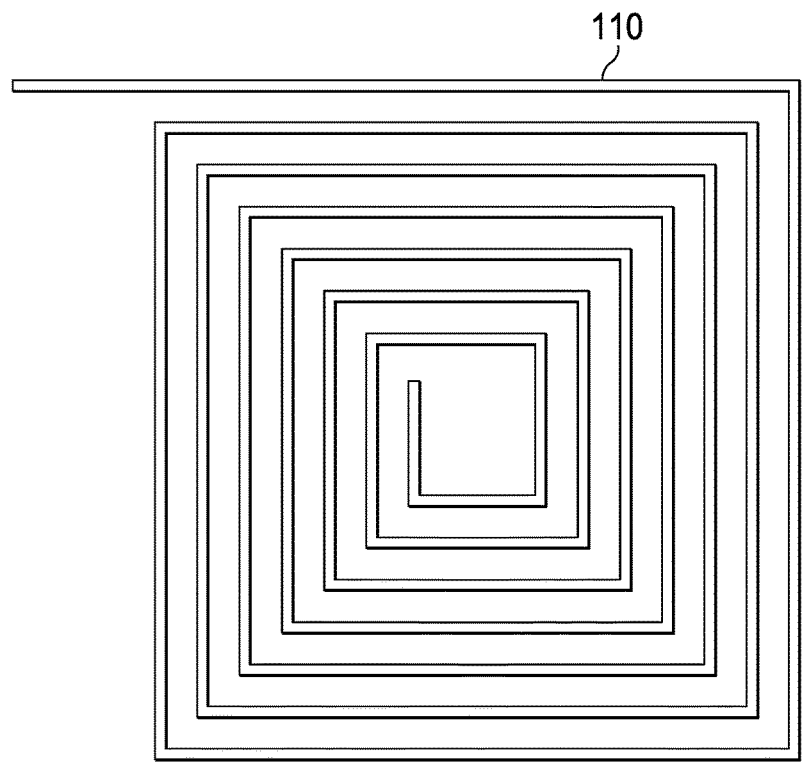
FIG. 1B and FIG. 1C are top down views of a square and a circular embedded inductor coil, respectively.

Corresponding numerals and symbols in the different figures generally refer to corresponding parts, unless otherwise indicated. The figures are not necessarily drawn to scale. As is further described hereinbelow, certain structures and surfaces are described as being "parallel" to one another.

For purposes of this disclosure, two elements are "parallel" when the elements are intended to lie in planes that, when extended, will not meet. However, the term parallel as used herein also includes surfaces that may slightly deviate in direction due to manufacturing tolerances, if the two surfaces generally lie in planes that are spaced apart and which would not intersect when extended infinitely if made the surfaces were made without these deviations, these surfaces are also parallel. Parallel surfaces extend in a direction side by side and do not meet.

FIG. 1A is a cross section of an integrated circuit 105 containing an inductor coil 110 embedded in inter-metal dielectric (IMD) in interconnect layer 114. Integrated circuit 105 is formed on a semiconductor substrate 108. Semiconductor substrate 108 can be a semiconductor material such as silicon, gallium arsenide, silicon germanium or other semiconductor used for the fabrication of integrated circuits. Semiconductor substrate 108 can include epitaxial layers. The interconnect layer 114 may contain multiple layers of conductive interconnect material separated by additional layers of IMD. In an example process, interconnect layer 114 includes conductive layers of aluminum and aluminum alloys. In an alternative process, the interconnect layer 114 includes copper and copper alloys. Interconnect layer 114 can include interconnect layers formed using single damascene and dual damascene processes. The embedded inductor coil 110 is electrically isolated from the semiconductor substrate 108 by a dielectric such as pre-metal dielectric (PMD) and possibly one or more layers of IMD. The embedded inductor coil 110 can be formed simultaneously with the formation of one of the layers of conductive interconnect material used in forming the integrated circuit (not shown).

Semiconductor substrate 108 has a first surface, shown as the upper surface of the semiconductor substrate 108 as oriented in FIGS. 1A, 2A, for example, where semiconductor processing forms active devices such as transistors. The semiconductor substrate 108 also has an opposing second surface, shown as the bottom surface of the semiconductor substrate 108 as oriented in FIGS. 1A, 2A. During processing on the first surface, the second surface of the semiconductor substrate may be adhered to a support tape. As is further described hereinbelow, in some examples, processing is performed on the second surface. The integrated circuit 105 includes a portion of semiconductor substrate 108 spaced apart from the embedded inductor coil 110 where active devices such as metal oxide semiconductor (MOS) transistors, diodes, and silicon controlled rectifiers (SCRs) can be formed using semiconductor processing including implanting dopant ions, anneal, dielectric and interconnect metal depositions, photolithographic patterning and etching processes (these active devices are not shown). The integrated circuit 105 can include electrical connections between the embedded coil 110 and one or more active devices formed on the semiconductor substrate 108 to form a circuit (not shown). The integrated circuit 105 is mounted on a die attach pad 102 that is part of lead frame 107 using a die attach compound 106. A wire bond 118 electrically connects a bond pad 116 on the surface of integrated circuit 105 to lead 104 on the lead frame 107. A second lead 103 on lead frame 107 shown in FIG. 1A is not connected in this cross section but can be connected in another portion outside of this cross section. Bond pad 116 is electrically connected to circuitry within integrated circuit (not shown) by vias and/or by additional interconnect in interconnect layer 114.

Figure 1C:
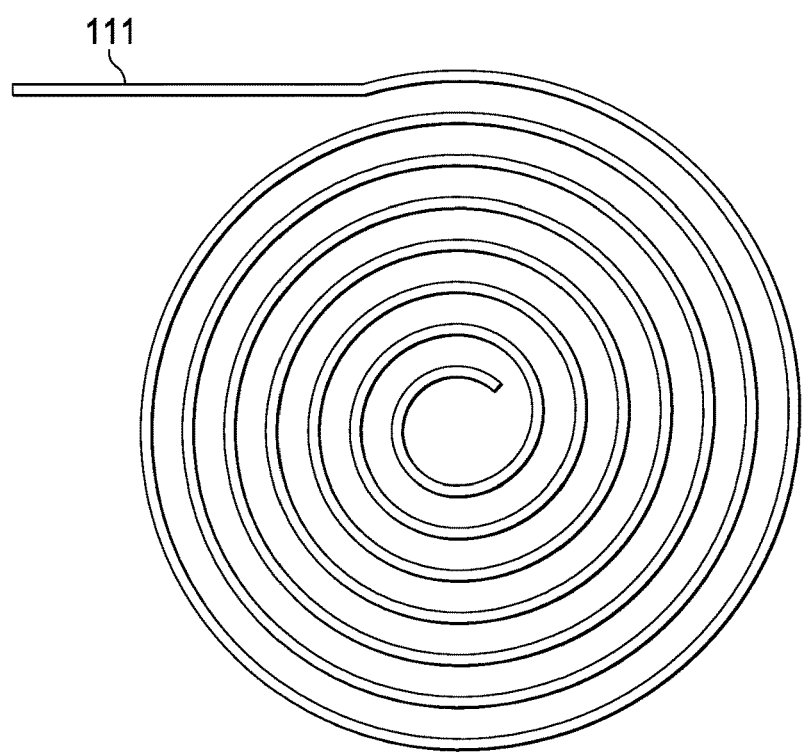

A top down view of the embedded inductor coil 110 is illustrated in FIGS. 1B and 1n FIG. 1C. The size and spacing of the inductor coil windings and the number of coil windings depends upon the value of inductance required. In one example, the embedded inductor coil 110 is square as shown in FIG. 1B. In another example, the embedded coil is a circular coil 111 as illustrated in another top down view in FIG. 1C. In another alternative example, the embedded coil 110 is a rectangular shaped coil (not shown) which is an extension of the square shape shown in FIG. 1B.

Returning to FIG. 1A, when current flows through the embedded inductor coil 110, the magnetic fields induced around the spiral inductor coil windings extend into the semiconductor substrate 108 to a depth proportional to the size of the embedded inductor coil. The semiconductor substrate 108 is low resistance (typically 5 mohm-cm to 25 mohm-cm) and the time varying magnetic field in the coil windings of the inductor coil 110 induces an electric field (E) in the semiconductor substrate 108 that produces an eddy current opposing the current flowing in the embedded inductor coil 110. The electric field (E) is predicted by Faraday's law. The opposing eddy current acts in a manner similar to a shorted secondary winding in a parasitic transformer, and this opposing eddy current can cause a 50% or more loss in Q for the inductor coil 110. The reduction in Q results in reduced efficiency during power transfer and limits the frequency of operation in RF circuits.

Figure 2B:
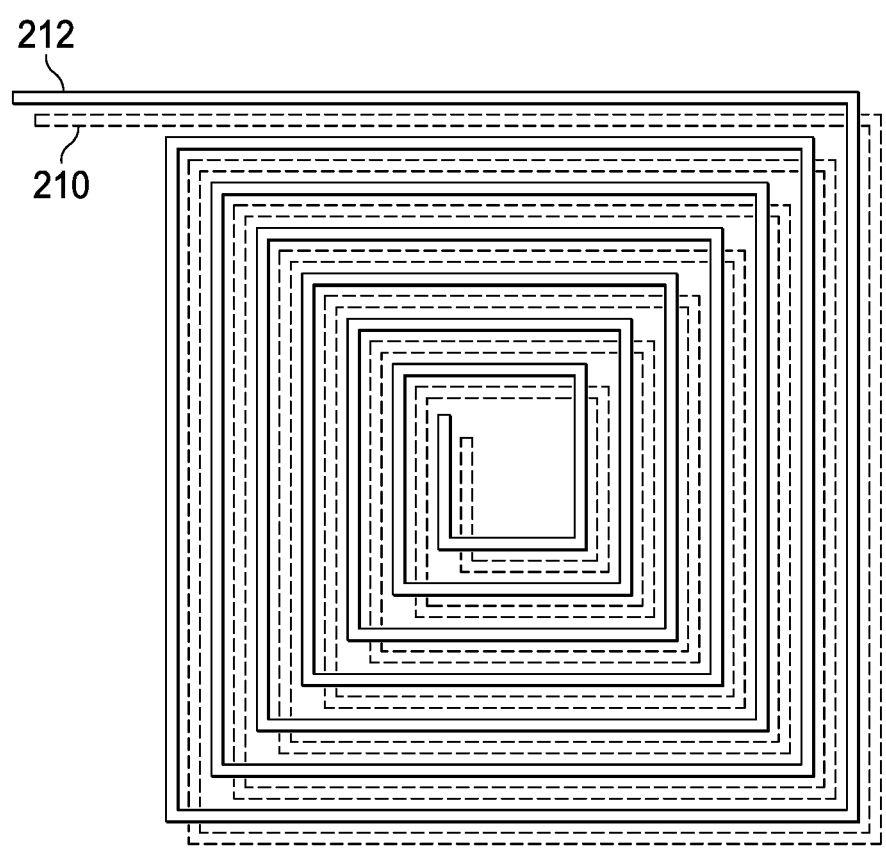

FIG. 2A illustrates in a cross section an integrated circuit 205 containing transformer coils 210 and 212. Transformer coils 210 and 212 are embedded in IMD in interconnect layer 214. In FIGS. 2A and 2B, similar reference labels are used for similar elements shown in FIGS. 1A and 1B, for clarity. For example, semiconductor substrate 208 in FIG. 2A corresponds to the semiconductor substrate 108 in FIG. 1A. The interconnect layer 214 can contain multiple layers of interconnect metal (not shown) separated by layers of IMD. The embedded coils 210 and 212 are formed in two such interconnect layers, however additional interconnect layers can be present. The lower embedded transformer coil 212 formed closest to the first surface of semiconductor substrate 208 in FIG. 2A is electrically isolated from the semiconductor substrate 208 by a dielectric, such as PMD and possibly by one or more layers of IMD. The lower embedded transformer coil 212 can be formed simultaneously and of the same conductive material as one of the lower layers of interconnect for the integrated circuit 205. The second, upper embedded transformer coil 210 can be formed simultaneously and of the same conductive material as an upper layer of interconnect for the integrated circuit 205. The upper transformer coil 210 is vertically disposed above the lower transformer coil 212 and is electrically isolated from the lower transformer coil 212 by one or more layers of IMD. The integrated circuit 205 is mounted on the die attach pad 202 of lead frame 207 using a die attach compound 206. A wire bond 218 electrically connects a bond pad 216 on integrated circuit 205 to lead 204 on the lead frame 207. Bond pad 216 is electrically connected to circuitry within integrated circuit (not shown) by vias and/or by interconnect in interconnect layer 214. A second lead 203 on lead frame 207 shown in FIG. 2A is not used in this illustration.

Top down views of the embedded transformer coils 210 and 212 are illustrated in FIG. 2B. In the example arrangement of FIG. 2B, the center of the upper embedded transformer coil 210 is aligned with the center of the lower transformer coil 212 so the coil windings of embedded transformer coil 210 lie exactly on top of the coil windings of embedded transformer coil 212. Note that in FIG. 2B the transformer coils, 210 and 212, are shown slightly offset for visibility of the lower transformer coil 210, for ease of use of the drawing. The lower transformer coil 210 is shown as a dashed outline as it lies below coil 212. The embedded transformer coils 210 and 212 may be square as shown in FIG. 2B, or may be another shape such as circular coils or rectangular coils. Transformers with upper 210 and lower 212 transformer coils with the same number of coil windings are used to electrically isolate two circuits or sub-circuits that operate at the same voltage.

In alternative arrangements, transformers with upper transformer 210 and lower 212 transformer coils with a different number of coil windings are used to electrically isolate two circuits or sub-circuits that operate at different voltages.

Embedded transformers experience a reduction in performance and operational frequency due to a reduction in the quality metric Q caused by parasitic eddy currents induced in the semiconductor substrate 208. The reduction in Q is similar to the reduction of performance in the inductor coil 110 in FIG. 1A. The embedded inductor coils 110 (FIGS. 1A and 1B), 210 and 212 (FIGS. 2A and 2B) are planar coils formed in a layer of interconnect material, with the coils lying in a plane oriented in a direction that is parallel to the first surface of the semiconductor substrate 208.

Integrated circuits with one embedded inductor coil and with two embedded inductor coils forming a transformer are used to illustrate various example arrangements hereinbelow. Integrated circuits with a plurality of embedded inductor coils and with a plurality of embedded transformer coils can also be used to form further alternative arrangements.

Figure 3B:
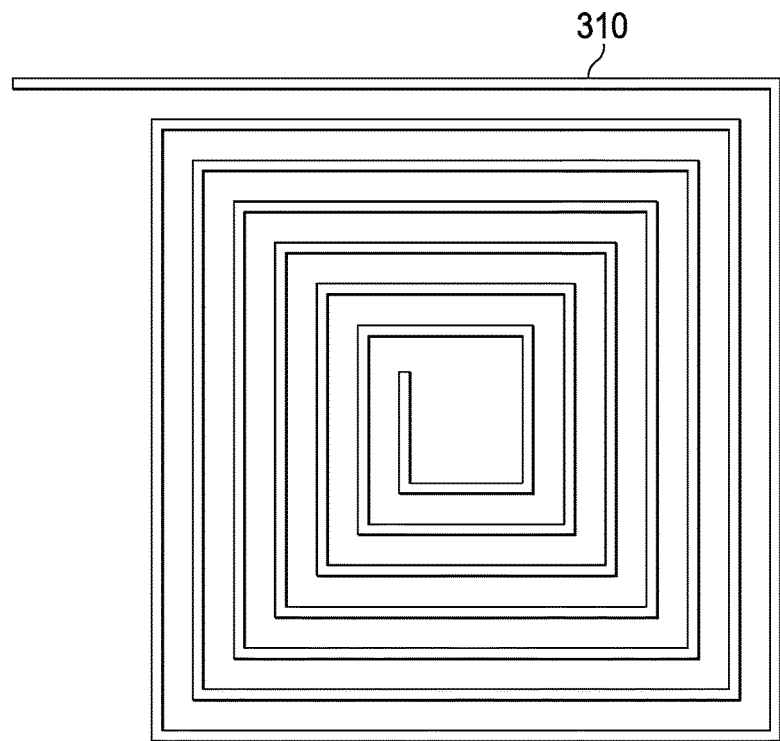
FIG. 3B is a top down view of the embedded inductor coil in FIG. 3A
Figure 3C:
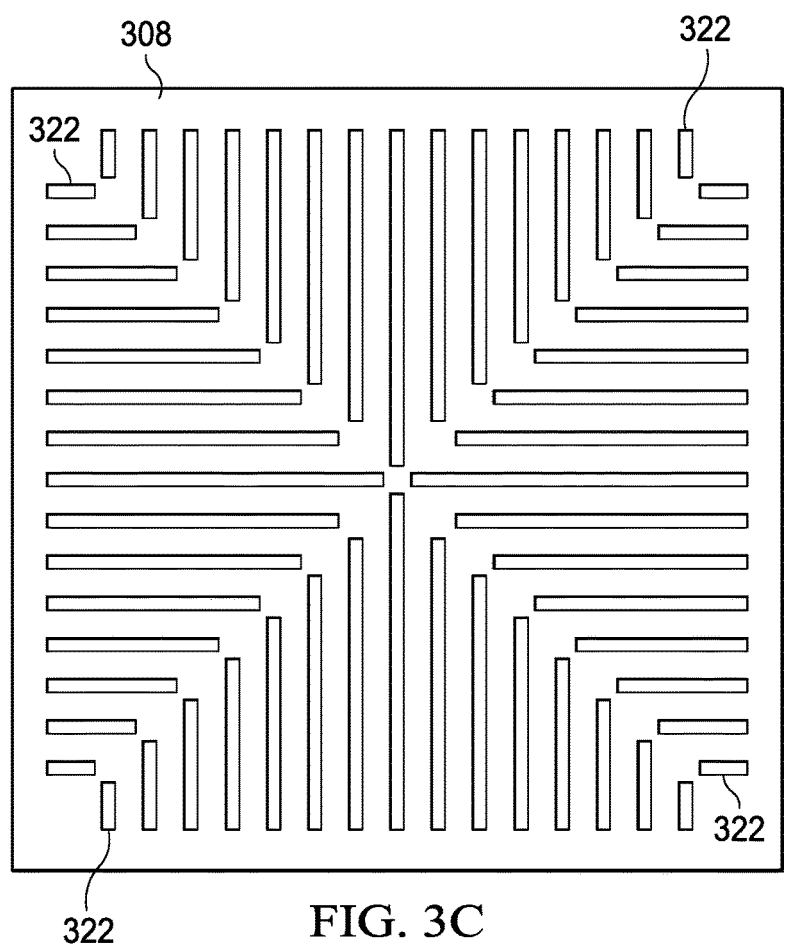
FIG. 3C is a top down view of the trenches in FIG. 3A.
Figure 3D:
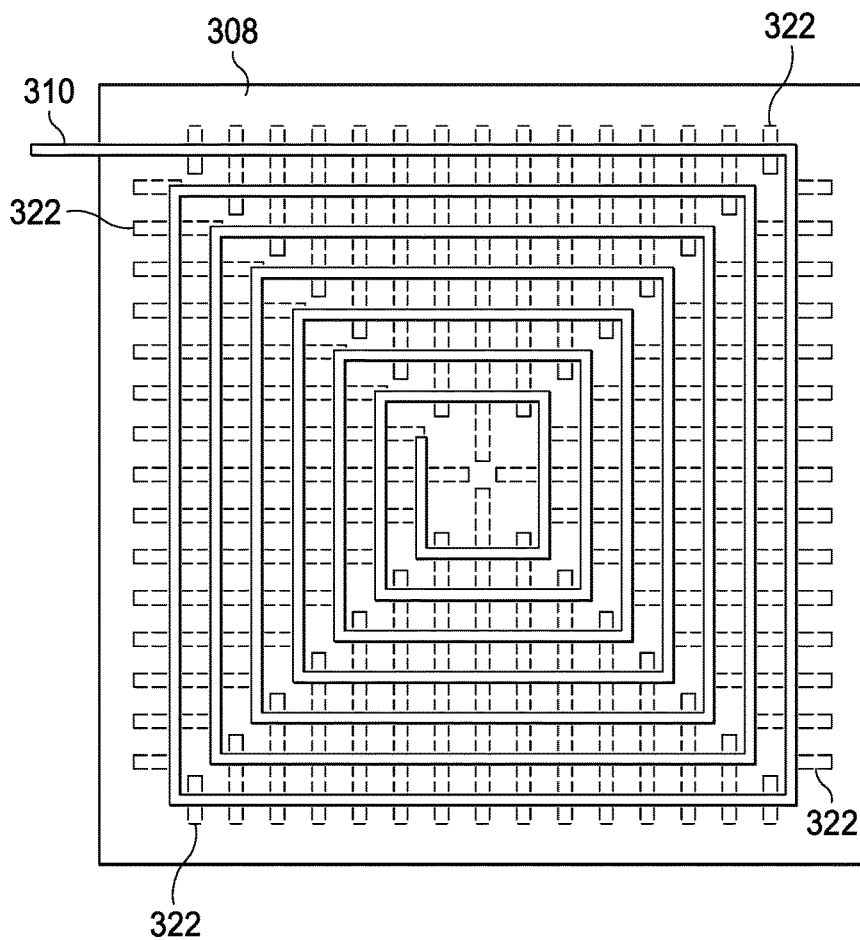
FIGS. 3D and 3E are top down views of an embedded inductor coil stacked on trenches.

FIG. 3A is a cross section of an example arrangement including integrated circuit 305 with an embedded inductor coil 310. FIGS. 3B, 3C, and 3D are top down views of the embedded inductor coil 310 of FIG. 3A.

FIG. 3A shows a representative cross section of an integrated circuit 305 with an embedded inductor coil 310 having dielectric filled trenches 322. In FIG. 3A similar reference labels are used for similar elements shown in FIG. 1A, for clarity. For example, semiconductor substrate 308 in FIG. 3A corresponds to the semiconductor substrate 108 in FIG. 1A. The trenches 322 in FIG. 3A penetrate deep into the semiconductor substrate 308 in a portion of semiconductor substrate 308 underlying the embedded inductor coil 310. It is desirable that the depth of the trenches 322 into the semiconductor substrate 308 is at least equal to the radius of the overlying embedded inductor coil 310 to minimize the effect of the magnetic field in the fringe field region. Optionally the trenches 322 can penetrate completely through the semiconductor substrate 308 as in the example shown in FIG. 3A. The inductor coil 310 lies in a plane that is parallel to the first surface of semiconductor substrate 308 and which is oriented in a horizontal direction above the upper surface of semiconductor substrate 308 in the orientation shown in FIG. 3A. The trenches 322 extend into the semiconductor substrate 308 in a direction that is at an angle that is approximately perpendicular to or normal to the plane of the planar embedded inductor coil 310, and the trenches 322 are oriented in a vertical direction in the orientation shown in FIG. 3A. The interconnect layer 314 can contain multiple layers of interconnect (not shown) separated by layers of IMD. The embedded inductor coil 310 can be formed simultaneously with one of the layers of interconnect metal and lie coplanar with the layer of interconnect. The embedded inductor coil 310 is electrically isolated from the underlying semiconductor substrate 308 by dielectric such as PMD and possibly by one or more layers of IMD. The integrated circuit 305 is mounted on a die attach pad 302 of lead frame 307 using a die attach compound 306. A wire bond 318 electrically connects a bond pad 316 on integrated circuit 305 to a lead 304 on the lead frame 307. A second lead 303 of lead frame 307 shown in FIG. 3A is not connected in this illustration but can be connected in another portion outside of this cross section. The bond pad 316 is electrically connected to circuitry within the semiconductor substrate 308 using vias and interconnect in interconnect layer 314 that are not shown, for clarity of illustration. Additional circuitry (not shown) can be formed in the first surface of semiconductor substrate 308 in portions not containing the trenches 322 and away from the embedded inductor coil 310. Interconnect material and vias between layers of interconnect material can connect the embedded inductor coil 310 to the additional circuitry (not shown).

As shown in FIG. 3A, trenches 322 penetrate vertically deep into and possibly through the portion of semiconductor substrate 308 that underlies the embedded inductor coil 310. Note that the cross section shown in FIG. 3A cuts through the trenches 322 in a different place than the cross section cuts through the embedded coil 310, as is further described hereinbelow. The cross section in FIG. 3A is drawn to illustrate the orientation of the trenches 322 with respect to the semiconductor substrate 308. The trenches 322 extend into semiconductor substrate 308 in a direction that is normal to the direction of the plane that the planar embedded coil 310 lies in. As shown in FIG. 3A, embedded coil 310 lies in a horizontal plane, and the trenches 322 are shown at an angle that is perpendicular or approximately normal to that plane, which is vertical in FIG. 3A. After the trenches are formed, these trenches 322 are refilled with a replacement dielectric such as an epoxy, polyimide, benzocyclobutene (BCB), a ceramic filled polymer, or other insulating material. The high resistance of the trenches 322 blocks the path of the eddy currents induced in the semiconductor substrate 308 by the current flowing in the coil 310, thereby significantly improving Q. Note that the representative cross sectional views in FIG. 3A cut through the embedded inductor coils 310 and the trenches 322 in different portions. As is described further hereinbelow, the trenches 322 and the coil windings of the embedded inductor coil 310 are arranged so the trenches 322 have a longitudinal direction that is perpendicular or normal to the longitudinal direction of that portion of the embedded inductor coil that overlies the trenches. FIG. 3A shows a representational cross section taken across the embedded inductor coil 310 and taken across the trenches. These cuts are taken at two different locations, to cut across both materials, to better illustrate the features.

Optionally the trenches 322 may be filled with a ferrite filled dielectric polymer to additionally improve Q. In this additional arrangement, the ferrite material becomes magnetized in a direction opposite to the magnetic field generated by the embedded inductor coil 310, additionally opposing the formation of eddy currents in the semiconductor substrate 308.

A top down view of an example embedded inductor coil 310 is illustrated in FIG. 3B. In the example of FIG. 3B, the coil is a square shape. In an alternative, the coil 310 can be a rectangular coil. In yet another alternative arrangement, the embedded inductor coil 310 may be a continuous circular coil with a decreasing radius for each circular coil winding such as is illustrated in FIG. 1C, or may be a continuous square coil with a decreasing diagonal for each square coil winding as shown in FIG. 3B. Other coil winding shapes are also possible. The width, spacing and number of coil windings in the embedded inductor coil 310 depends upon the inductance requirements of the integrated circuit 305.

A top down view of trenches 322 which penetrate deep into the semiconductor substrate 308 (as shown in FIG. 3A) is illustrated in FIG. 3C. The longitudinal dimension of the trenches 322 are oriented at an angle that is approximately perpendicular to the longitudinal dimension of the corresponding portion of the coil windings in the overlying embedded inductor coil 310, to maximally retard induced eddy currents in the semiconductor substrate 308. The longitudinal dimensions are parallel with the first surface of the semiconductor substrate 308 and the depth dimension is perpendicular or normal to the first surface of the semiconductor substrate 308. Other trench 322 layouts can be used. As the windings of coil 310 change longitudinal direction, the trenches 322 also change longitudinal direction so that the trenches 322 remain oriented in a longitudinal direction that is approximately perpendicular to the longitudinal direction of that portion of the inductor coil 310 that lies above the individual trenches 322.

FIG. 3D shows a top down view of the embedded inductor coil 310 overlying the trenches 322 in the semiconductor substrate 308. The trenches 322 are shown in dashed outlines in FIG. 3D as the trenches lie beneath the coil 310, and for improved visibility. In this example arrangement, the trenches 322 extend past the outermost coil winding of the embedded inductor coil 310 at least twice the width of the windings of embedded coil 310 in the semiconductor substrate 308. This example arrangement is useful to minimize effects in the fringe field regions. The trenches 322 are shown having a longitudinal direction oriented approximately perpendicular to the longitudinal direction of the portion of coil 310 overlying the individual trenches 322. In the example of FIG. 3D, the coil 310 is shown as a square coil with four sides, so the windings of coil 310 have two longitudinal directions; in the orientation of FIG. 3D, the windings of coil 310 for two sides, the top and bottom sides in FIG. 3D, extend from left to right across FIG. 3D. The trenches 322 that lie beneath the windings of coil 310 for these two sides therefore extend up and down as oriented and shown in FIG. 3D, with a longitudinal direction that is perpendicular or normal to the longitudinal direction of the overlying portions of windings of coil 310. In addition the coil 310 has two sides that are shown with windings having a longitudinal direction that is up and down in FIG. 3D, while for those two opposing sides of the square shaped inductor coil 310, the underlying trenches 322 have a longitudinal direction oriented from left to right in FIG. 3D. By forming the trenches 322 to have a longitudinal direction that is normal to the corresponding portion of the overlying coil 310, the induced eddy current in the semiconductor substrate 308 from coil 310 is reduced or prevented in semiconductor substrate 308, which increases the Q factor for coil 310.

Figure 3E:
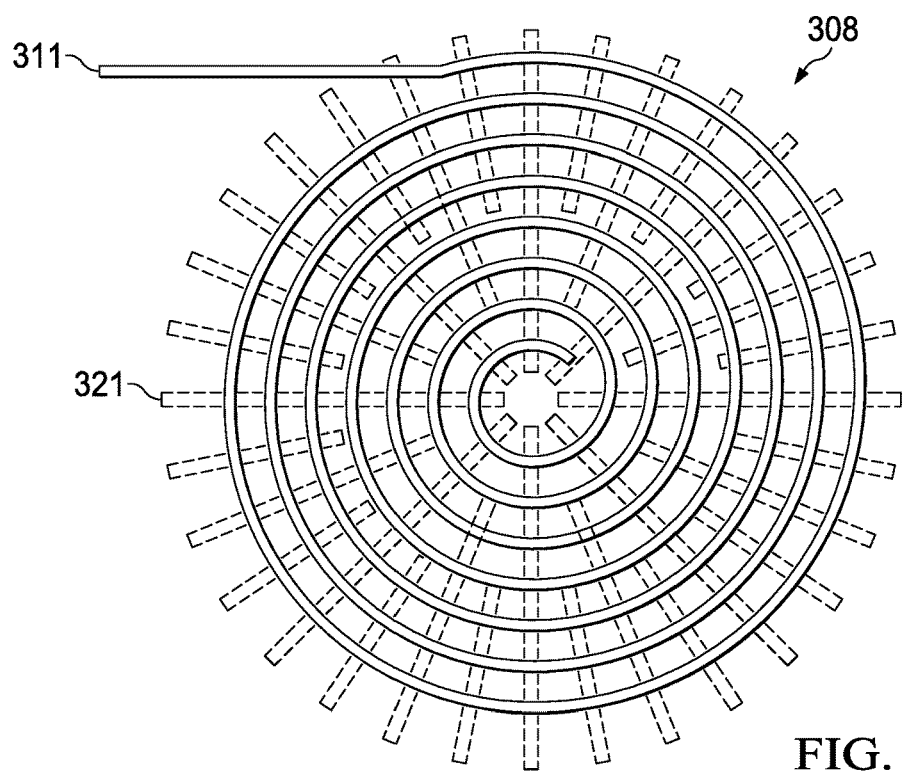

FIG. 3E shows a top down view of the circular embedded inductor coil 311 overlying the trenches 321 in the semiconductor substrate 308. The longitudinal dimensions of trenches 321 are substantially perpendicular to the longitudinal dimension of the circular embedded inductor coil 311. The trenches 321 are shown in dashed outlines in FIG. 3E for better visibility. In an arrangement such as in the example in FIG. 3E having a circular embedded coil, the trenches 321 will be oriented to have a longitudinal direction that is substantially perpendicular to that portion of the circular embedded coil 310 that lies over the particular trench 322. As is shown in FIG. 3E, this arrangement results in straight trenches 322 radiating outwards from a central portion of the circular embedded coil 310, forming a radial pattern.

Figure 4B:
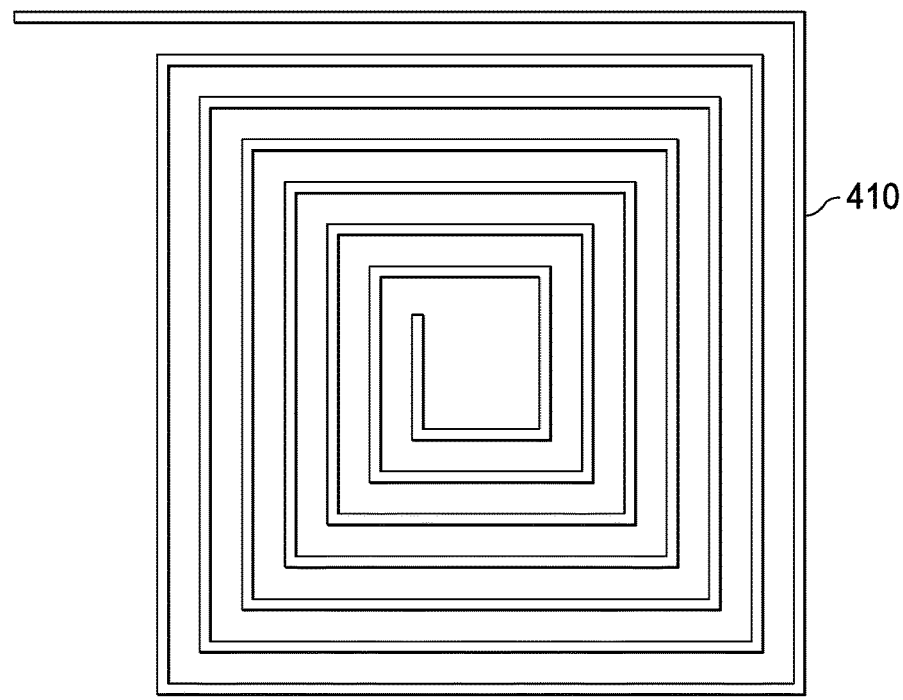
FIG. 4B is a top down view of the embedded inductor coil in FIG. 4A.
Figure 4C:
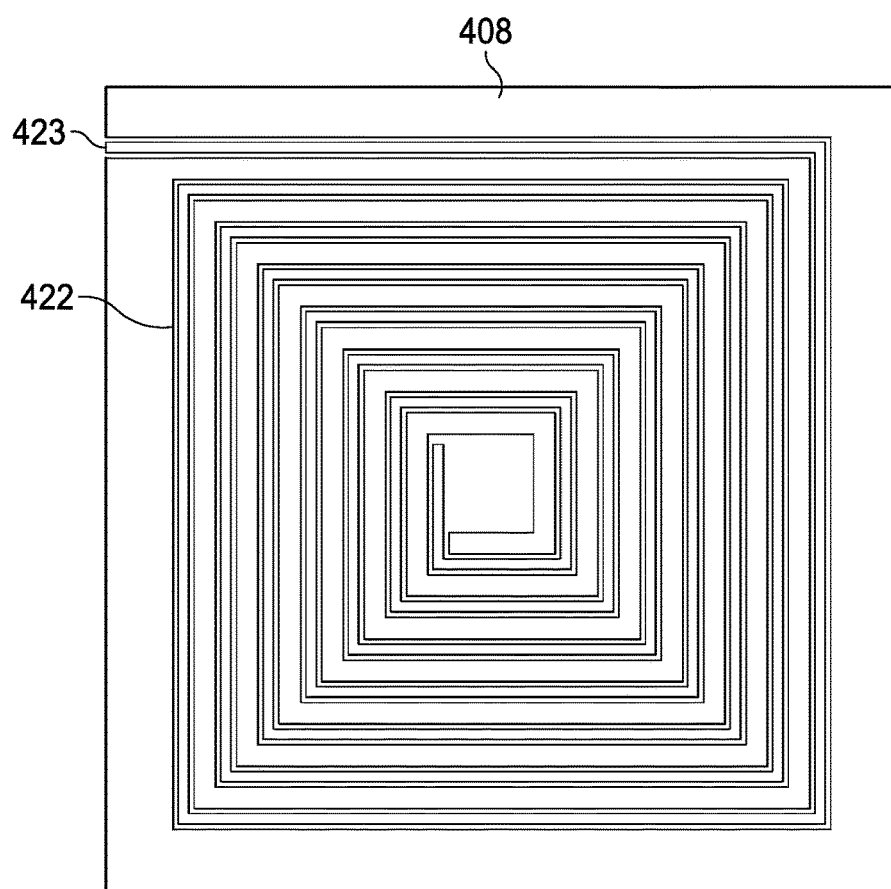
FIG. 4C is a top down view of the substrate inductor coil in FIG. 4A.
Figure 4D:
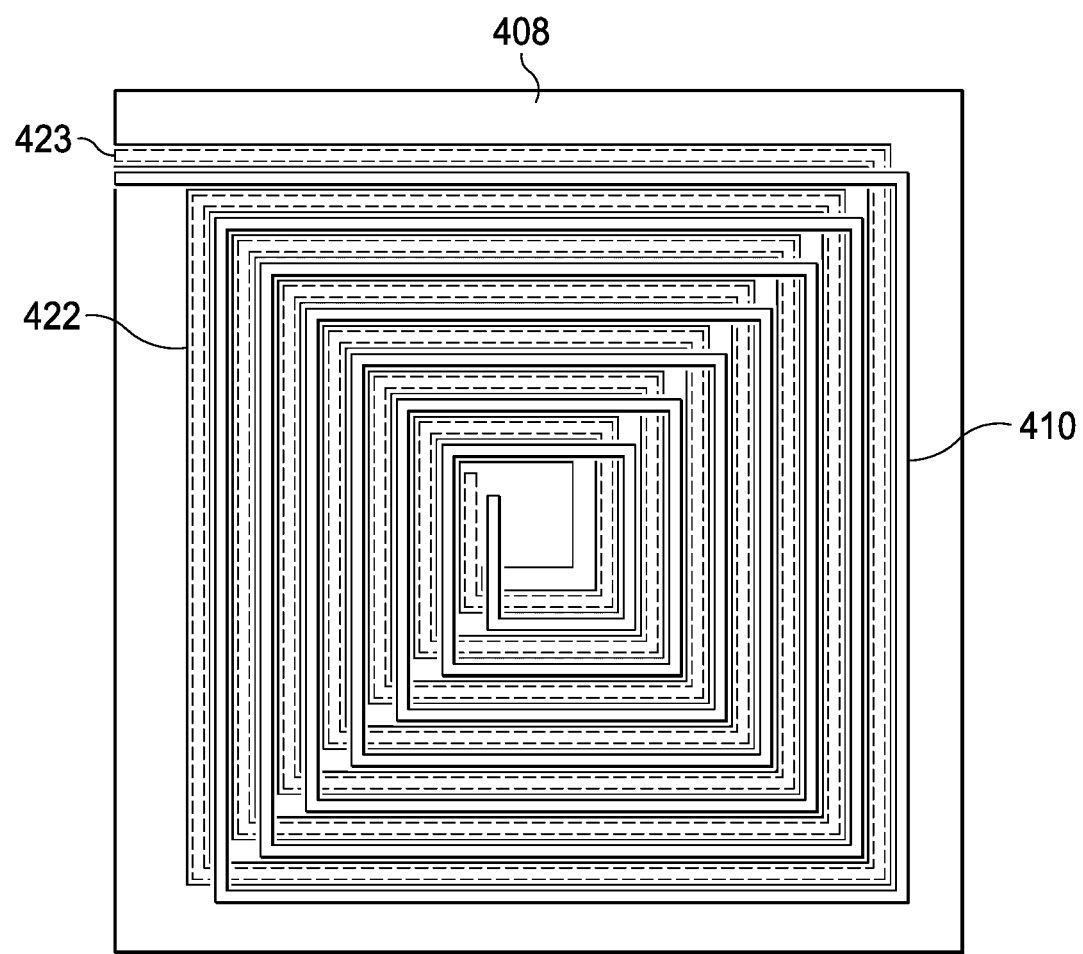
FIG. 4D is a top down view of the integrated circuit including an embedded inductor coil stacked on the substrate inductor coil.

FIG. 4A illustrates another integrated circuit 405 with an embedded inductor coil 410 in a further example arrangement. Top down views of the embedded inductor coil 410 are depicted in FIGS. 4B, 4C, and 4D.

FIG. 4A shows in a representative cross section of an embedded inductor coil 410 with an underlying substrate coil 423. In FIG. 4A, similar reference labels are used for similar elements shown in FIG. 1A, for clarity. For example, semiconductor substrate 408 in FIG. 4A corresponds to the semiconductor substrate 108 in FIG. 1A. The substrate coil 423 is formed by etching a trench 422 in the coil spaces between the coil windings of the embedded inductor coil 410, through the dielectric layers below the embedded inductor coil 410 and into the underlying semiconductor substrate 408. The coil 410 is used as an etch mask to form the substrate coil 423. The coil spacings form the substrate coil spacings in the substrate inductor coil 423. By patterning a trench 422 into the semiconductor substrate 408, a substrate coil 423 forms that has the same width and number of windings as the overlying embedded inductor 410. The interconnect layer 414 may contain multiple layers of interconnect (not shown) separated by layers of IMD. The embedded inductor coil 410 is electrically isolated from the underlying semiconductor substrate 408 by dielectric such as PMD and possibly one or more layers of IMD. The embedded inductor coil 410 can be formed simultaneously and of the same conductive material as one of the layers of interconnect. The integrated circuit 405 is mounted on a die attach pad 402 of lead frame 407 using a die attach compound 406. A wire bond 418 electrically connects a bond pad 416 on the integrated circuit 405 to a lead 404 on the lead frame 407. A second lead 403 on lead frame 407 shown in FIG. 4A is not used in this illustration.

As shown in FIG. 4A, trench 422 is formed in the coil spaces between the coil windings of the embedded inductor coil 410, and is etched through the underlying dielectric and etched through the semiconductor substrate 408 that underlies the embedded inductor coil 410. Alternatively the trench 422 may be etched deep into but not through the semiconductor substrate 408. It is preferred that the depth of the trench 422 is at least equal to the radius of the embedded inductor coil 410 to minimize the effects in the fringe field region. The trench 422 forms the coil spacings of an inductor coil in the semiconductor substrate 408 (substrate inductor coil 423). The trench 422 is refilled with a replacement dielectric that electrically isolates and strengthens the coil windings of the substrate inductor coil 423.

The substrate inductor coil 423 can be electrically connected in parallel with the embedded inductor coil 410, providing additional inductance while at the same time reducing the formation of parasitic eddy currents in the semiconductor substrate 408. When the substrate inductor coil 423 is employed to provide additional inductance, the trench 422 penetrates completely through the semiconductor substrate 408 to electrically isolate the substrate inductor coil 423 from the semiconductor substrate 408.

Referring again to FIG. 4A, in an additional optional alternative, a portion of the lead frame 407 (typically at least half the thickness of the portion of the lead frame 402) underlying the substrate coil 423 can be etched away and replaced with a dielectric material 426. In this alternative, the dielectric material 426 additionally improves performance by reducing the negative impact on Q from parasitic eddy currents that can form in the lead frame 407.

FIG. 4B is a top down view of the embedded inductor coil 410. The embedded inductor coil 410 can be square as shown in FIG. 4B or can be another shape such as a circular coil or a rectangular coil. The width and spacing and number of coil windings in the embedded inductor coil 410 and the substrate inductor coil 423 depend upon the inductance requirements of the integrated circuit 405.

FIG. 4C illustrates a top down view of the semiconductor substrate 408 with a trench 422 in the coil spaces between the coil windings of the substrate inductor coil 423.

FIG. 4D shows a top down view of the embedded inductor coil 410 overlying the substrate inductor coil 423. Substrate inductor coil 423 is drawn in dashed outlines in FIG. 4D as it lies below the embedded inductor coil 410, for better visibility.

In this example, the embedded inductor coil 410 and the substrate inductor coil 423 have the same coil winding width and spacing and the same number of coil windings. The embedded inductor coil 410 is displaced vertically over the substrate inductor coil 423 and is separated from the substrate inductor coil 423 with a dielectric such as PMD. The embedded inductor coil 410 is formed in a layer of interconnect material and is a planar coil. The embedded inductor coil 410 lies in a plane parallel to the first surface of the semiconductor substrate 408 (see FIG. 4A). The center of the embedded inductor 410 is aligned with the center of substrate inductor coil 423 so the coil windings of embedded inductor coil 410 lie exactly on top of the coil windings of substrate inductor coil 423. Note that in FIG. 4D the coils are shown slightly offset for enabling visibility of the substrate coil 423. In fact the substrate coil is aligned with the embedded inductor coil 410 due to the method used to form the substrate coil 423.

Figure 5:
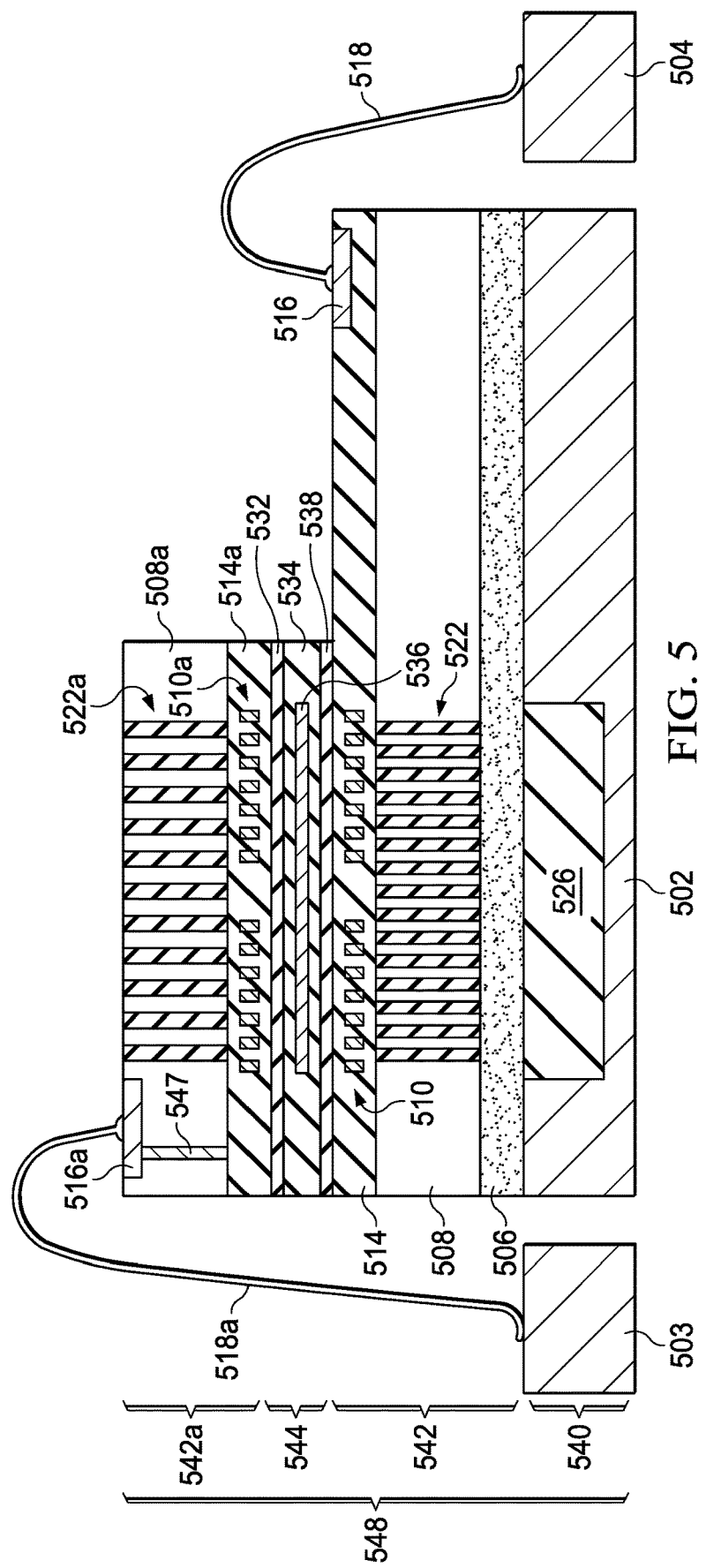
FIG. 5 is a cross sectional view of a transformer formed by inverting and bonding a second IC with a second inductor coil to the surface of a first IC with a first inductor coil, with the second inductor coil aligned to the first inductor coil.

FIG. 5 is a cross section of an arrangement including a transformer 548 formed by bonding the first surface a first inverted integrated circuit chip 542a with an embedded inductor coil 510a to the first surface of a second integrated circuit chip 542 also with an embedded inductor coil 510. In FIG. 5 similar reference labels are used for similar elements shown in FIG. 1A, for clarity. For example, semiconductor substrates 508 and 508a in FIG. 5 correspond to the semiconductor substrate 108 in FIG. 1A. The embedded inductor coil 510a (second or secondary transformer coil) in the inverted overlying integrated circuit 542a is aligned to the embedded inductor coil 510 (first or primary transformer coil) in the underlying integrated circuit 542. The integrated circuits 542 and 542a may be bonded together with a dielectric bonding material, 532 and 538, such as an epoxy or polyimide. Optionally, to improve coupling between the primary and secondary transformer coils, 510a and 510, a layer of magnetic core material 536 may be inserted between the overlying second transformer coil 510a and the underlying first transformer coil 510. The ferrite core 536 is surrounded by dielectric 534 and bonded to the overlying inverted integrated circuit 542a using a dielectric adhesive 532 and bonded to the underlying integrated circuit 542 also using a dielectric adhesive 538 such as an epoxy or polyimide adhesive.

The number of coil windings in the second transformer coil 510a and the first transformer coil 510 may be the same if the operating voltages in the two coupled integrated circuits 542 and 542a are the same. Alternatively the number of coil windings may be different if the operating voltages are different.

The first integrated circuit 542 with an embedded inductor coil 510 is shown in cross section in FIG. 5. Dielectric filled trenches 522 penetrate deep into or completely through the semiconductor substrate 508 underlying the embedded inductor coil 510. The interconnect layer 514 can contain multiple layers of interconnect separated by layers of 1 MB. The embedded inductor coil 510 can be formed simultaneously with one of the layers of interconnect and is electrically isolated from the underlying semiconductor substrate 508 by a dielectric such as PMD. The integrated circuit 542 is mounted on a lead frame 540 die attach pad 502 using a die attach compound 506. A wire bond 518 electrically connects a bond pad 516 on the surface of integrated circuit 542 to a stitch bond on the lead frame 540. Optionally, a portion of the thickness of the lead frame 540 under the improved embedded inductor coil 510 can be replaced with dielectric material 526 to reduce the formation of parasitic eddy currents in the lead frame 540 additionally improving Q. In an example about half the thickness of a portion of the lead frame 502 is removed but more than half or less than half can also be removed.

In FIG. 5, a second integrated circuit 542a with an embedded inductor coil 510a is shown inverted and bonded to the first integrated circuit 542 with an embedded inductor coil 510 to form a transformer 548. In one example, the dielectric filled trenches 522a penetrate deep into the semiconductor substrate 508a. In another example the dielectric filled trenches 522a penetrate completely through the semiconductor substrate 508a overlying the embedded inductor coil 510a in the inverted integrated circuit chip 542a. The interconnect layer 514a can contain multiple layers of interconnect separated by layers of 1 MB. The embedded inductor coil 510a can be formed simultaneously with one of the layers of interconnect and is electrically isolated from the semiconductor substrate 508a by a dielectric such as PMD. A bond pad 516a formed on the exposed second surface of the semiconductor substrate 508a is electrically connected to circuits formed on the first surface of the semiconductor substrate 508a with a through silicon via (TSV) 547. A wire bond 518a electrically connects the bond pad 516a connected to the TSV 547 to lead 503 on the lead frame 540.

FIG. 5 shows a transformer 548 formed by bonding two integrated circuits, 542 and 542a, each with one embedded inductor coil, 510 and 510a. In one example arrangement, one of the integrated circuits, 542 and 542a, includes more than one embedded inductor coil. In another example arrangement, both integrated circuits include more than one embedded inductor coil.

Figure 6:
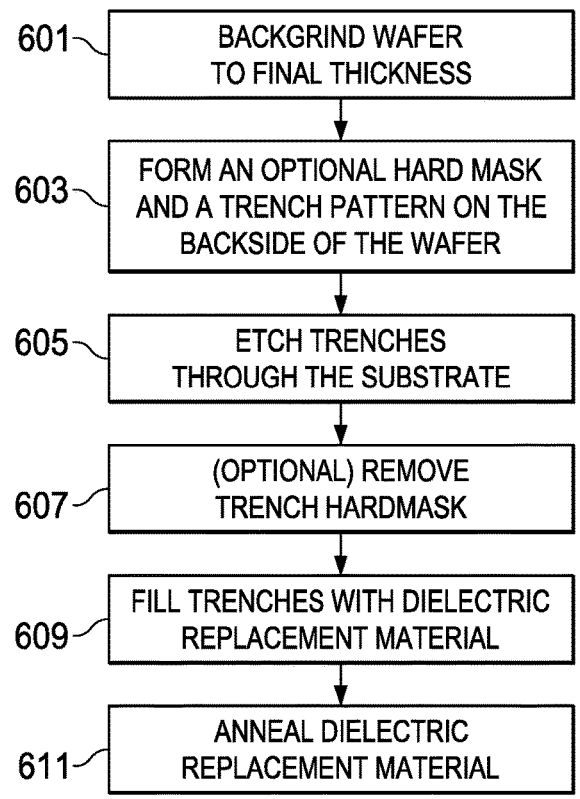
FIG. 6 is a flow diagram of a method for forming an integrated circuit with embedded transformer coils and with trenches filled with replacement dielectric formed in the semiconductor substrate underlying the transformer coils.

FIGS. 7A through 7D are a series of cross sections showing the results of a method for forming an integrated circuit 705 with embedded inductor or transformer coils, 710, 712 similar to that illustrated in FIGS. 3A through 3D. FIG. 6 is a flow diagram of the method. An integrated circuit 705 with transformer coils, 710 and 712, embedded in 1 MB in an interconnect layer 714 overlying the first surface of a semiconductor substrate 708 is used to describe the method. The method also applies to an integrated circuit with an embedded inductor coil (integrated circuit 705 with one of the transformer coils such as 712 omitted). The method of FIG. 6 forms trenches 722 such as described in FIG. 3C in the semiconductor substrate 708 under the embedded transformer coils, 710 and 712. In this method, the number of coil windings in the embedded transformer coils, 710 and 712, need not be the same. In the method of FIG. 6, either the trenches such as shown in FIGS. 3A-3D, or the substrate coils, such as shown in FIGS. 4A-4D, can be formed using processing on the second surface to etch the semiconductor substrate. These processes can be performed after the processing on the first side of the semiconductor substrate and are referred to as "backside" processes. Because the backside etch is performed independently of the formation of the embedded coils or embedded transformer embedded in the 1 MB layers, the trenches can be formed in any direction independent of the shape of the embedded coils.

Figure 7A:
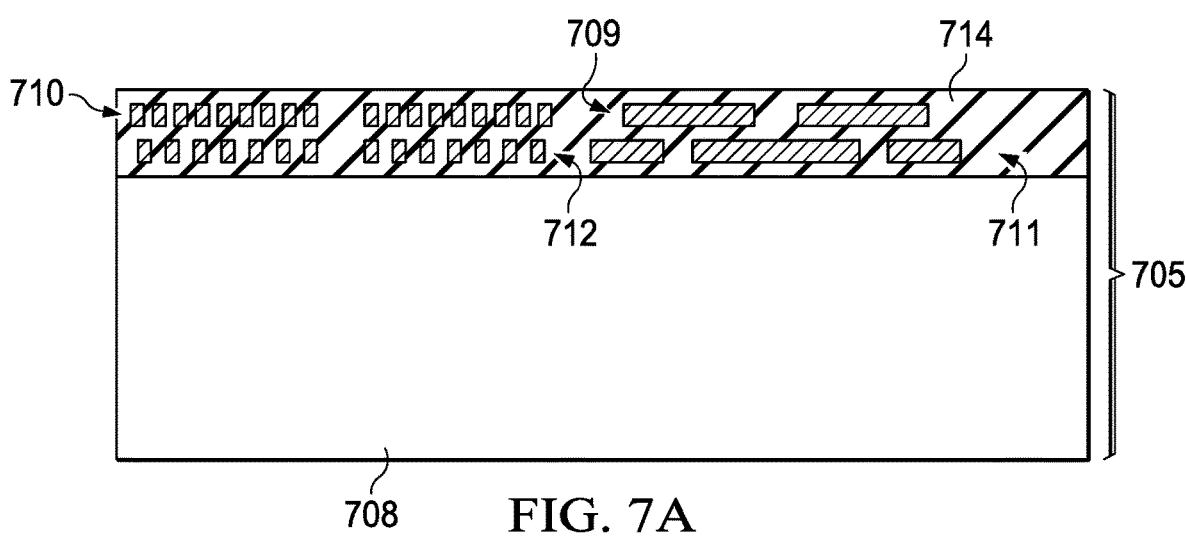
FIGS. 7A through 7E are cross sections illustrating steps in the flow diagram of FIG. 6.

FIG. 7A shows in a cross section an integrated circuit 705 with two transformer coils 710 and 712 embedded in IMD in the interconnect layer 714 overlying the first surface of a semiconductor substrate 708. In FIG. 7A similar reference labels are used for similar elements shown in FIG. 1A, for clarity. For example, semiconductor substrate 708 in FIG. 7A corresponds to the semiconductor substrate 108 in FIG. 1A. In an example, the integrated circuit 705 can include active devices formed in the first surface of semiconductor substrate 708 in a portion of the integrated circuit 705 not shown in the cross section of FIG. 7A. The interconnect layer 714 can contain multiple layers of interconnect (two example interconnect layers, 709 and 711 are illustrated) separated by one or more layers of IMD. The first transformer coil 712 that is closest to the first surface of semiconductor substrate 708 in FIG. 7A is electrically isolated from the semiconductor substrate 708 by a dielectric such as PMD and possibly one or more layers of IMD. First transformer coil 712 can be formed simultaneously and of the same conductive material as a lower layer of interconnect 711. The second transformer coil 710 is disposed above the first transformer coil 712 in FIG. 7A and is electrically isolated from the first transformer coil 712 by one or more layers of IMD. Second transformer coil 710 can be formed simultaneously with and of the same conductive material as an upper layer of interconnect 709. The center of the first (upper) transformer coil 710 is aligned with the center of the second (lower) transformer coil 712. The first and second transformer coils 710 and 712 are planar coils that each lie in a plane that is parallel to the first surface of semiconductor substrate 708. In the orientation of FIG. 7A, the planar coils are shown lying in horizontal planes.

The first step 601 in the flow diagram of FIG. 6 is to back grind the second surface of the semiconductor substrate 708 until the semiconductor substrate 708 is reduced to a final thickness. The thickness of the semiconductor substrate 708 may be in the range of 500 to 600 um before the back grind begins, and in one example the thickness of the semiconductor substrate 708 may be in the range of 150 to 250 um after the back grind.

Figure 7B:
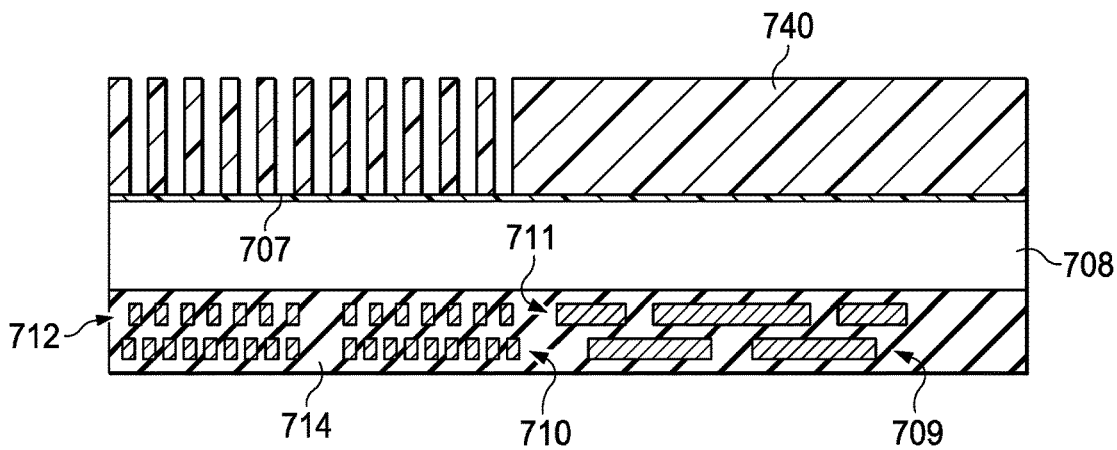
Figure 7C:
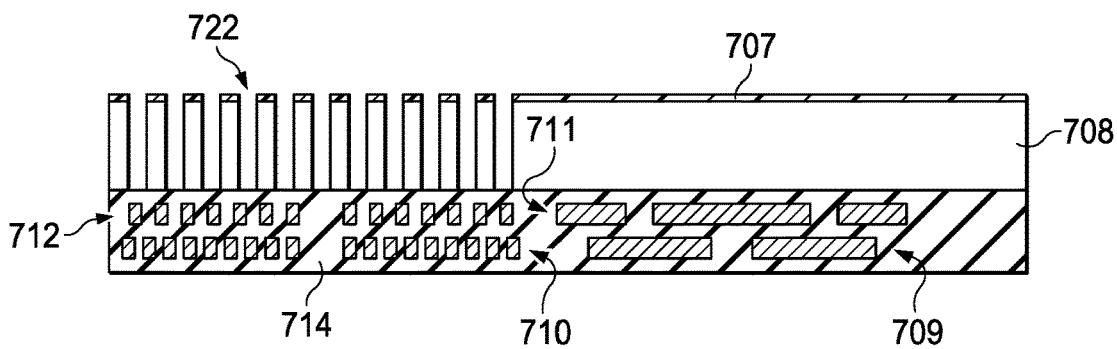
Figure 7D:
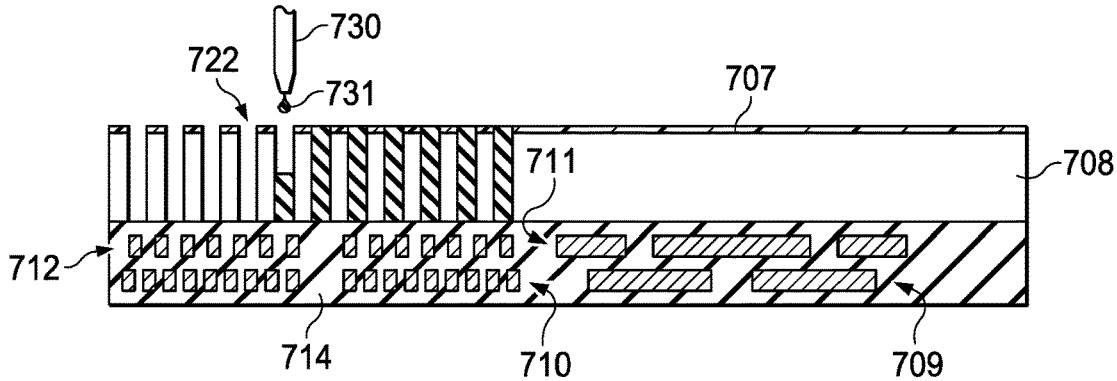

In step 603 (illustrated in FIG. 7B) the integrated circuit 705 is now shown inverted with respect to FIG. 7A and an optional hard mask material 707 is deposited on the second surface or the backside surface of the semiconductor substrate 708. A hard mask 707 can reduce the thickness of the photoresist that otherwise would be required to etch the deep trenches 722 (not shown in FIG. 7B, see FIG. 7C). A trench photoresist pattern 740 is formed on the optional hard mask 707 with trench openings over the embedded transformer coils, 710 and 712. The trench photoresist pattern 740 may form a trench pattern such as illustrated in FIG. 3C. Other trench layout patterns may also be used. The trench photoresist pattern 740 is aligned to the embedded inductor coil 712 or embedded transformer coils 710 and 712 so the trenches are formed in the portion of the semiconductor substrate 708 underlying the inductor coils in the IMD. Note that the cross section shown in FIG. 7B is a representational view to show the details of the photoresist pattern. In the trenches for the arrangement shown in FIG. 3C, the trenches are formed with a longitudinal direction that is at an angle to, and approximately perpendicular to, the longitudinal direction of the embedded coils. In the representational cross section of FIG. 7B, both the coils 712, 714 and the openings in the photoresist pattern 740 are shown as cut across, but this representational view is not the result of a single cut across the structure, as the trenches are aligned normal to the direction of the coils as described hereinabove, and not as shown in FIG. 7B. The method of FIG. 6 can also be used to form a substrate coil such as shown in FIGS. 4B-4D. In that case, the substrate coil is aligned to the embedded coils as described hereinabove.

In step 605 (illustrated in FIG. 7C) the optional hard mask 707 is etched through (if present). A deep reactive ion etching process etches the trenches 722 through the semiconductor substrate 708, stopping in the dielectric layer that isolates the embedded coil 712 from the semiconductor substrate 708. One example deep reactive ion etch (DRIE) process, referred to as the Bosch process, alternately removes silicon at the bottom of the etched trenches 722 and then passivates the sidewalls of the etched trenches 722 with polymer, so as to maintain a desired profile of the trenches 722 throughout the etching process. U.S. Pat. No. 9,419,075 describes the process of etching trenches through a semiconductor substrate and refilling the trenches with replacement dielectric and is hereby incorporated by reference in its entirety herein. The longitudinal dimension of trenches 722 in the semiconductor substrate 708 in the trench pattern 740 shown in FIG. 3C are oriented approximately at angle that is perpendicular to the longitudinal dimension of the coil windings in the overlying embedded transformer coils 710, 712 to maximally retard parasitic eddy currents from forming in the semiconductor substrate 708. The longitudinal dimensions are parallel with the first surface of the semiconductor substrate 708 of integrated circuit 705. The width and spacing of the trenches 722 can vary from 10 um to greater than 200 um. In an example integrated circuit with an improved embedded inductor the trench width is 50 um and the trench spacing is 80 um.

In step 607 the optional hard mask 707 is removed (if present). Alternatively, the optional hard mask 707 can be left in place to reduce processing cost.

Referring now to step 609 in FIG. 6, the trenches are filled with a dielectric replacement material 732. In one example, droplets of a dielectric containing fluid are used to fill the trenches 722 using a droplet dispensing apparatus 730 similar to an inkjet apparatus. In example arrangements, the dielectric containing fluid (ink) 731 includes: uncured epoxy; uncured polyimide; benzocyclobutene (BCB); ceramic slurry; sol-gel; siloxane-containing fluid; or other insulating material. In alternative examples, the dielectric containing ink 731 is a ferrite slurry or a ferrite containing polymer fluid. In operation, magnetic domains in the ferrite material become magnetized in a direction opposite to the magnetic field generated by the current flowing in embedded transformer coils 710 and 712, additionally retarding the formation of eddy currents in the semiconductor substrate 708. In an alternative example, the trenches 722 can be filled with dielectric replacement material using alternative methods.

Figure 7E:
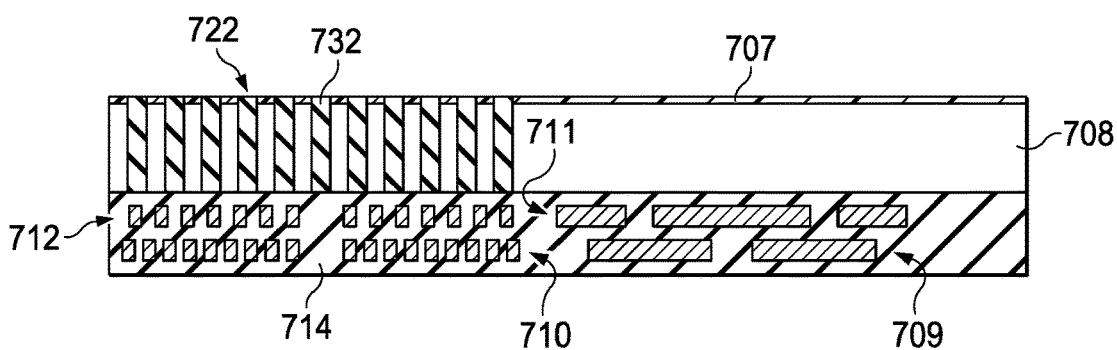

In step 611 (illustrated in FIG. 7E) the integrated circuit 705 with the dielectric replacement material 732 filled trenches 722 is annealed to drive off solvent and cure the dielectric replacement material 732. The anneal can be performed at a temperature in the range of about 80° C. to 300° C. In an additional example the anneal can also be performed at reduced atmospheric pressure to aid in the removal of bubbles and voids from the dielectric replacement material 732. In the cross sections of FIGS. 7C-7E, the trenches 722 and the coils 712 and 714 are shown, for illustrative purposes, in representational sectional views. However, as shown in FIGS. 3C and 3D above, the trenches 722 are formed having a longitudinal direction that is perpendicular to the longitudinal direction of the overlying embedded coil portions to maximally retard the eddy currents in the semiconductor substrate 708.

Figure 8:
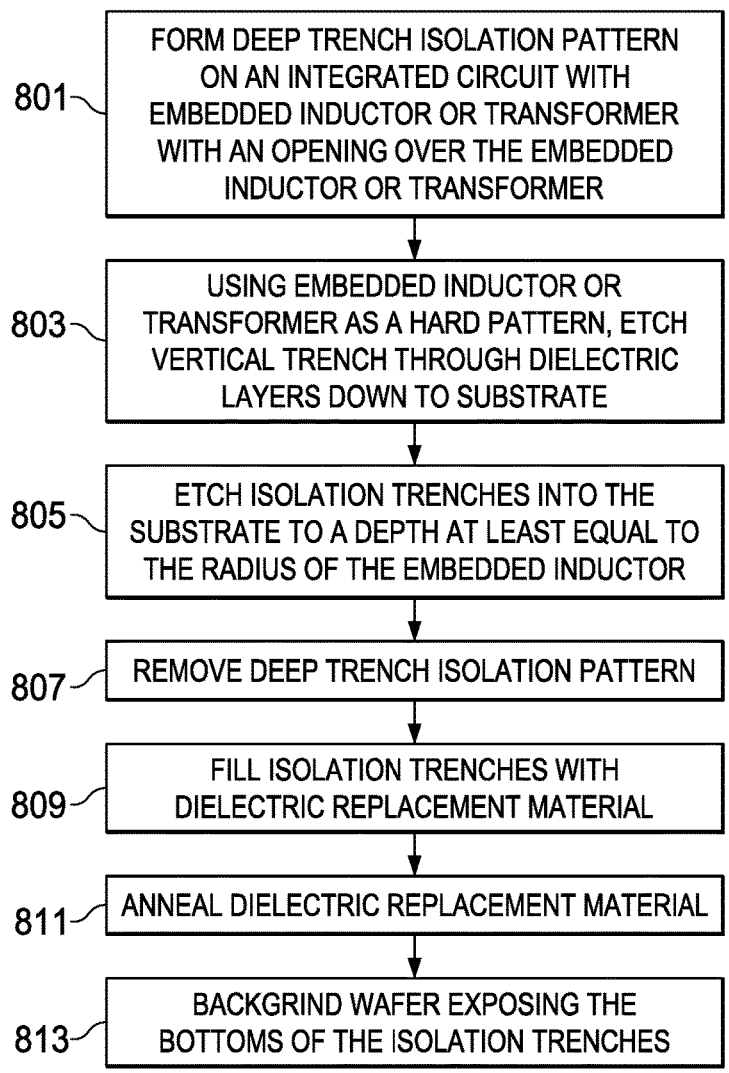
FIG. 8 is a flow diagram of another method for forming an integrated circuit with embedded transformer coils and with a substrate coil having a trench filled with replacement dielectric.

FIG. 8 is a flow diagram for a method for forming an integrated circuit arrangement with embedded inductor or transformer coils, similar to the one illustrated in FIGS. 4A through 4D. The method step results from the flow diagram in FIG. 8 are illustrated in a series of cross sections in FIGS. 9A through 9E. An integrated circuit 905 with transformer coils, 910 and 912, embedded in IMD in an interconnect layer 914 over the first surface of a semiconductor substrate 908 is used to describe the method of FIG. 8. An integrated circuit with an embedded inductor coil (integrated circuit 905 with one of the transformer coils 910 or 912 omitted) could equally well be used. In this method a substrate inductor coil 923 similar to the one described in FIG. 4C is formed in the semiconductor substrate 908 under the embedded transformer coils 910 and 912. When using the method of FIG. 8, the number of coil windings in the first transformer coil 910 and the second transformer coil 912 are the same. The method forms a substrate inductor coil 923 with the same size and with the same number of coil windings as the embedded transformer coils 910, 912.

Figure 9A:
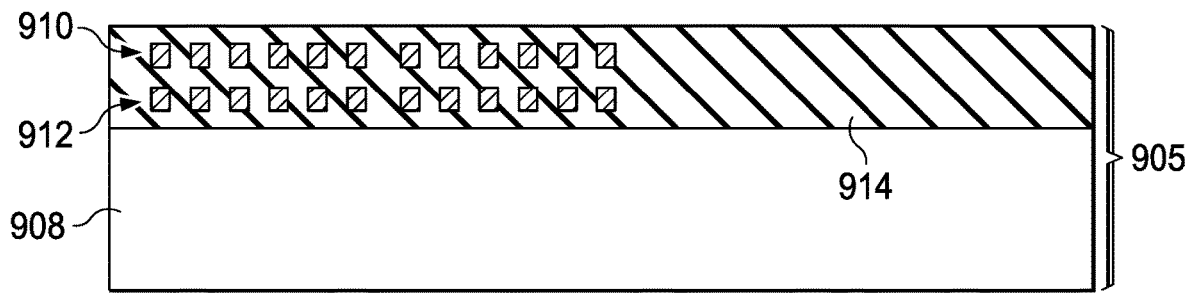
FIGS. 9A through 9E are cross sections illustrating steps in the flow diagram of FIG. 8.
Figure 9B:
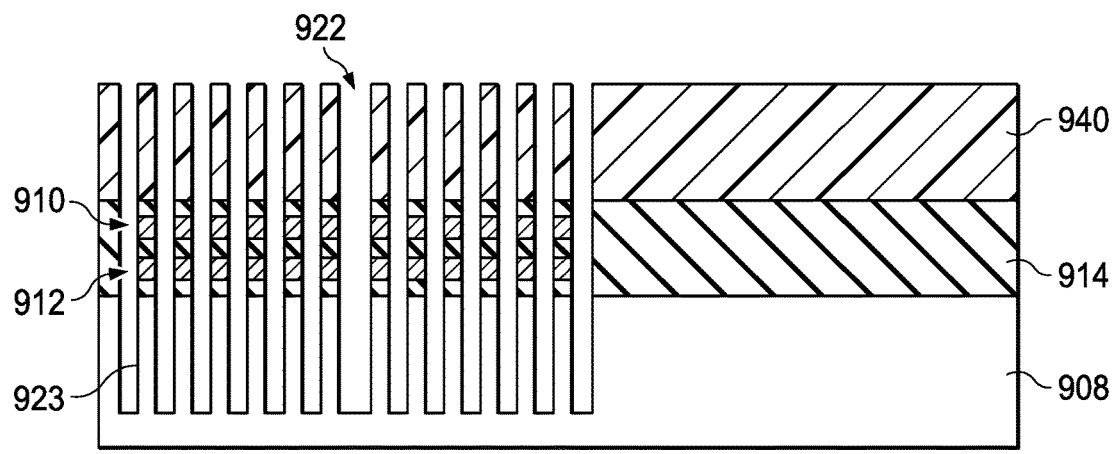
Figure 9C:
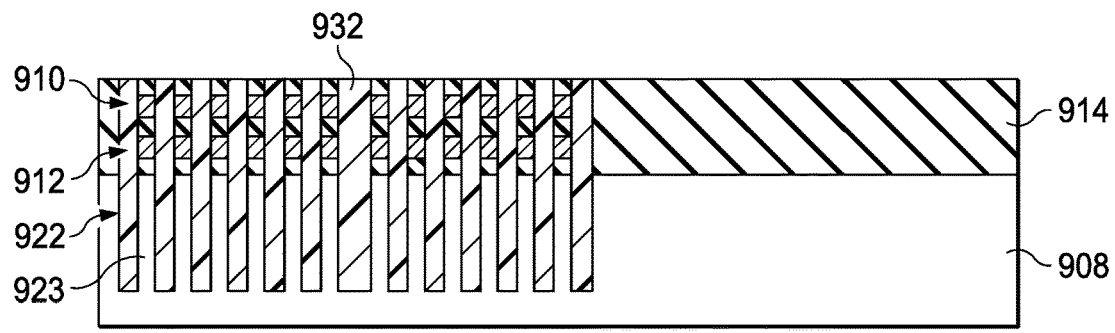

FIG. 9A shows an integrated circuit 905 with two embedded transformer coils 910, 912 overlying the first surface of semiconductor substrate 908. In an example, the integrated circuit 905 has active devices formed at the first surface in portions of the semiconductor substrate outside of the view shown in FIG. 9A. In another example, the semiconductor substrate 905 does not have active devices formed therein. In FIG. 9A similar reference labels are used for similar elements shown in FIG. 1A, for clarity. For example, semiconductor substrate 908 in FIG. 9A corresponds to the semiconductor substrate 108 in FIG. 1A. The interconnect layer 914 can contain multiple layers of interconnect (not shown) separated by multiple layers of IMD. The first transformer coil 912 which is closest to the first surface of semiconductor substrate 908 in FIG. 9A is electrically isolated from the semiconductor substrate 908 by a dielectric layer such as a PMD layer and possibly by one or more layers of IMD. The lower transformer coil 912 can be formed simultaneously with and of the same conductive material as one of the lower layers of interconnect used to form integrated circuit 905. The upper second transformer coil 910 is disposed above the first transformer coil 912 and is electrically isolated from the first transformer coil 912 by one or more layers of IMD. In the example arrangement of FIG. 9A, the two transformer coils 912 and 910 have the same coil winding width and spacing and both have the same number of coil windings. The center of the second (upper) transformer coil 910 is aligned with the center of the first (lower) transformer coil 912. The transformer coils 910, 912 are planar coils lying in planes that are parallel to the first surface of the semiconductor substrate 908. In the orientation shown in FIG. 9A, the transformer coils 910, 912 are oriented in horizontal planes.

The first step 801 in the flow diagram of FIG. 8 (illustrated in FIG. 9B) is to form a trench photo resist pattern 940 on the interconnect layer 914 with openings over the coil spaces of upper and lower transformer coils 910, 912.

In step 803 (illustrated in FIG. 9B) trenches 922 are first etched vertically through the IMD dielectric layers in the coil spaces between the coil windings of the upper and lower transformer coils 910, 912 and then through the underlying dielectric, stopping on the first surface of semiconductor substrate 908.

In step 805 (illustrated in FIG. 9B) trenches 922 are etched into the semiconductor substrate 908 from the first surface. In some examples the depth is at least equal to the radius of the transformer coils 910, 912. Alternatively, the trenches 922 may be etched into the semiconductor substrate 908 to a depth that exceeds the final thickness of the semiconductor substrate 908 after a back grind to be performed later in the method. If the substrate inductor coil 923 is going to be connected in parallel with the transformer coils 910 and 912 to provide additional inductance, the trenches 922 penetrate completely through the semiconductor substrate 908 to electrically isolate the substrate inductor coil 923.

The layout of the transformer coils 910 and 912 is transferred into the semiconductor substrate 908 forming an inductor coil (substrate inductor coil 923) in the semiconductor substrate 908. The trenches 922 in the coil spaces between the coil windings of the substrate inductor coil 923 block the path of induced parasitic eddy currents, significantly improving Q.

In step 807 the trench photoresist pattern 940 is removed.

In step 809 (illustrated in FIG. 9C) the trenches 922 are filled with a dielectric replacement material 932. In an example arrangement droplets of a dielectric containing fluid fill the trenches 922 using a droplet dispensing apparatus similar to an inkjet apparatus. The dielectric containing fluid can include, for example, uncured epoxy, uncured polyimide, ceramic slurry, sol-gel, a siloxane-containing fluid, or another insulating material. Alternatively the dielectric replacement material 932 can be a ferrite containing polymer fluid to additionally reduce the magnetic field in the semiconductor substrate 908. Alternative methods for providing the dielectric replacement material 932 can also be used.

In step 811 the dielectric replacement material 932 is annealed to drive off solvent and to cure the dielectric replacement material 932. The anneal can be performed at a temperature in the range of about 80° C. and 300° C. and in a reduced atmospheric pressure to aid in the removal of bubbles or voids from the dielectric replacement material.

Figure 9D:
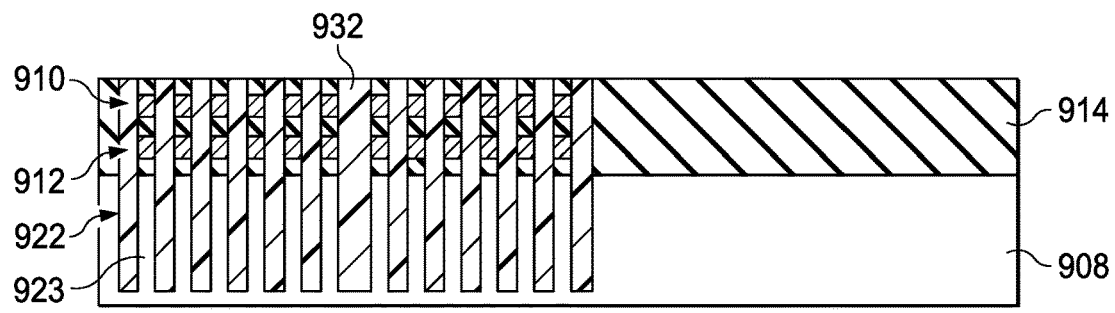
Figure 9E:
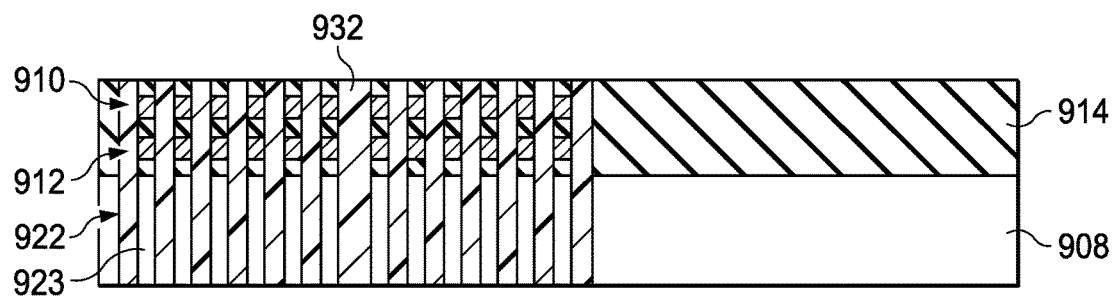

In step 813 (illustrated in FIG. 9D) back grinding of the semiconductor substrate 908 is performed to reach a final target semiconductor substrate 908 thickness. As is illustrated in FIG. 9D in one arrangement the trenches 922 penetrate into but do not penetrate completely through the semiconductor substrate 908. It some examples the trenches 922 penetrate into the semiconductor substrate 908 to a depth that is at least equal to the radius of the embedded transformer coils 910, 912.

Alternatively, in step 813 (illustrated in FIG. 9E) back grinding is performed on the semiconductor substrate 908, exposing the bottoms of the replacement dielectric material 932 filled trenches 922. In this alternative process the trenches 922 penetrate completely through the semiconductor substrate 908 and electrically isolate the substrate inductor coil 923 from the semiconductor substrate 908

Figure 10:
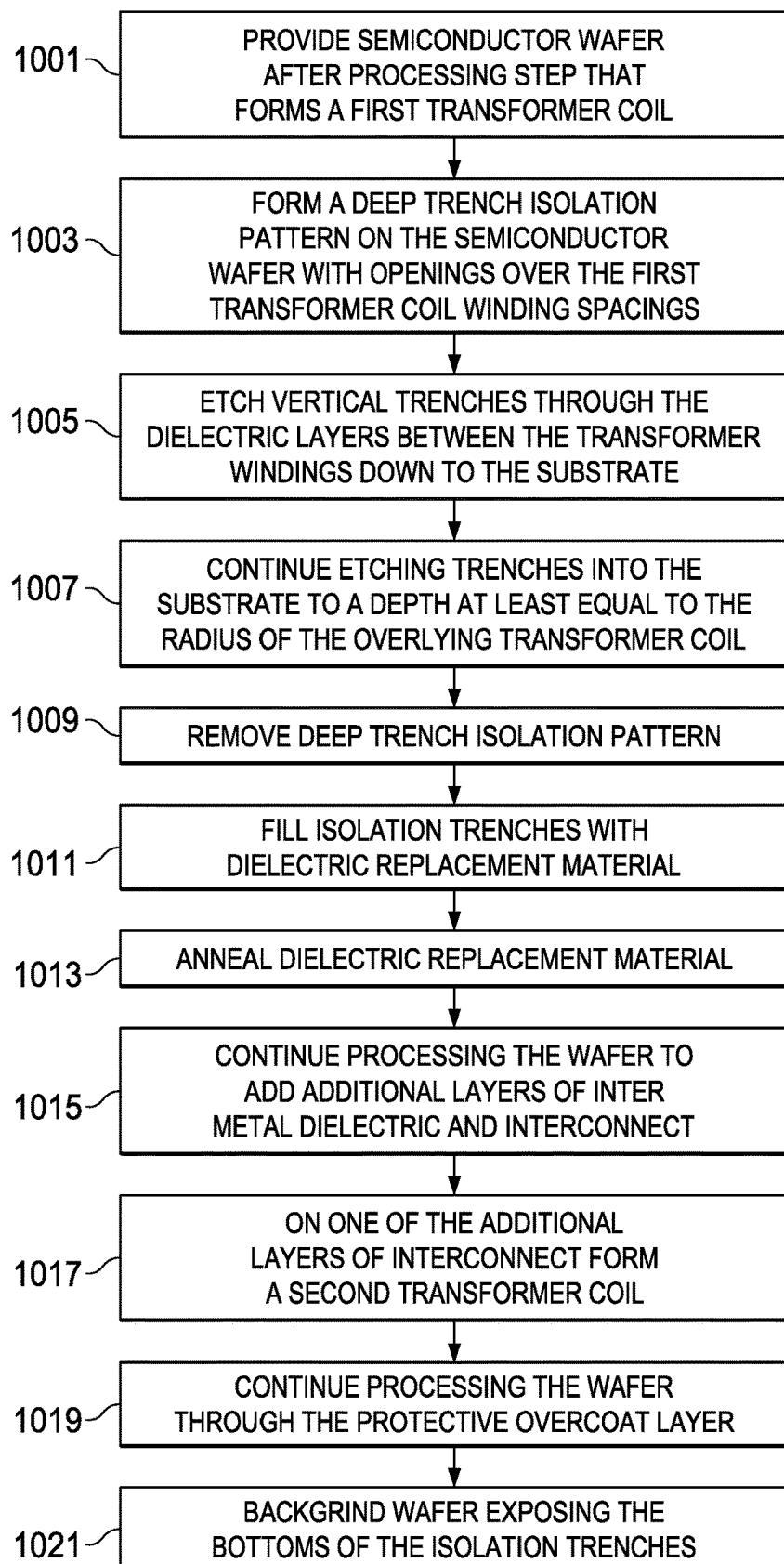
FIG. 10 is a flow diagram of an additional method for forming an integrated circuit with embedded transformer coils and with a substrate coil having a trench filled with replacement dielectric.

Another method for forming an integrated circuit with embedded transformer coils with an underlying substrate coil is described in the flow diagram in FIG. 10, and the result of the steps are illustrated in a series of cross sections in FIGS. 11A through 11G. Unlike the previously described method of FIG. 8, the method of FIG. 10 enables an integrated circuit 1105 with an improved transformer to be formed with a second (upper) transformer coil 1110 that can have a different number of coil windings and/or different coil winding width and spacing than the first (lower) transformer coil 1112. Alternatively, the method can also be used to form an upper coil with the same number of coil windings, spacing, and width as the lower coil.

Figure 11A:
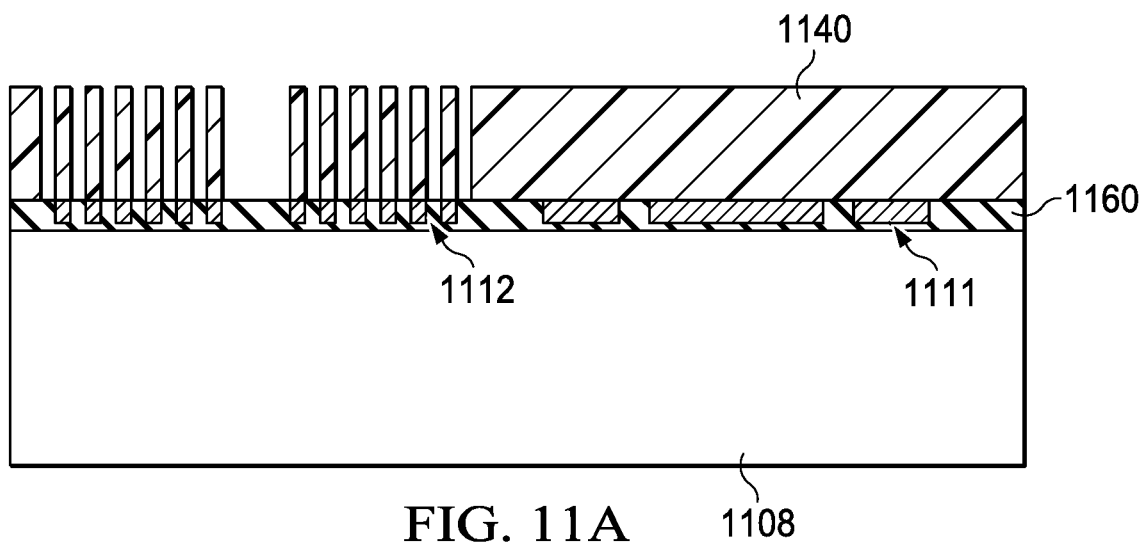
FIGS. 11A through 11G are cross sections illustrating steps in the flow diagram of FIG. 10.
Figure 11A:
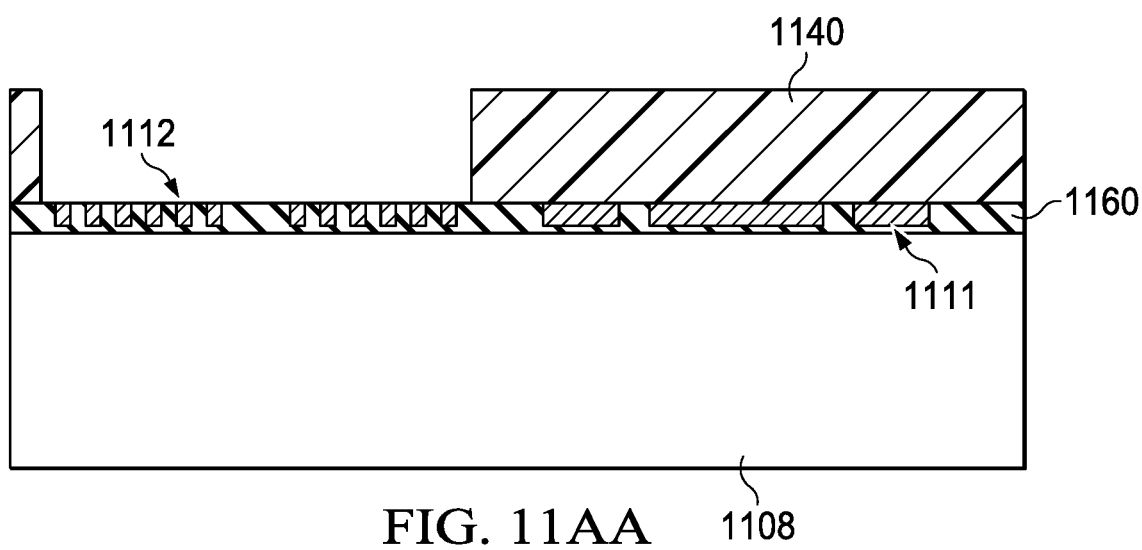

FIG. 11A shows a trench photo resist pattern 1140 that is formed on a semiconductor substrate 1108 processed through the formation of the first transformer coil 1112 (step 1001 in FIG. 10). In FIG. 11A similar reference labels are used for similar elements shown in FIG. 1A, for clarity. For example, semiconductor substrate 1108 in FIG. 11A corresponds to the semiconductor substrate 108 in FIG. 1A. Interconnect layer 1160 can contain multiple layers of interconnect (not shown) separated by multiple layers of IMD. The first transformer coil 1112 which is formed closest to the first surface of semiconductor substrate 1108 as shown in FIG. 11A is electrically isolated from the semiconductor substrate 1108 by a dielectric layer such as PMD and possibly by one or more layers of IMD. The first transformer coil 1112 can be formed simultaneously and of the same conductive material as one of the lower layers of interconnect, shown as 1111.

Step 1003 in the flow diagram of FIG. 10 (illustrated in FIG. 11A) forms a trench photoresist pattern 1140 on the interconnect layer 1160 with an opening over the coil spaces of the first transformer coil 1112.

Alternatively FIG. 11AA illustrates the trench photoresist pattern 1140 can be open over the coil windings and coil spaces of the first transformer coil 1112. In this implementation the coil windings of first transformer coil 1122 is a hard mask to etch the trench 1122. This etch step enables the trenches 1122 (see FIG. 11B) to be self-aligned to the coil windings of the first transformer coil 1112.

Figure 11B:
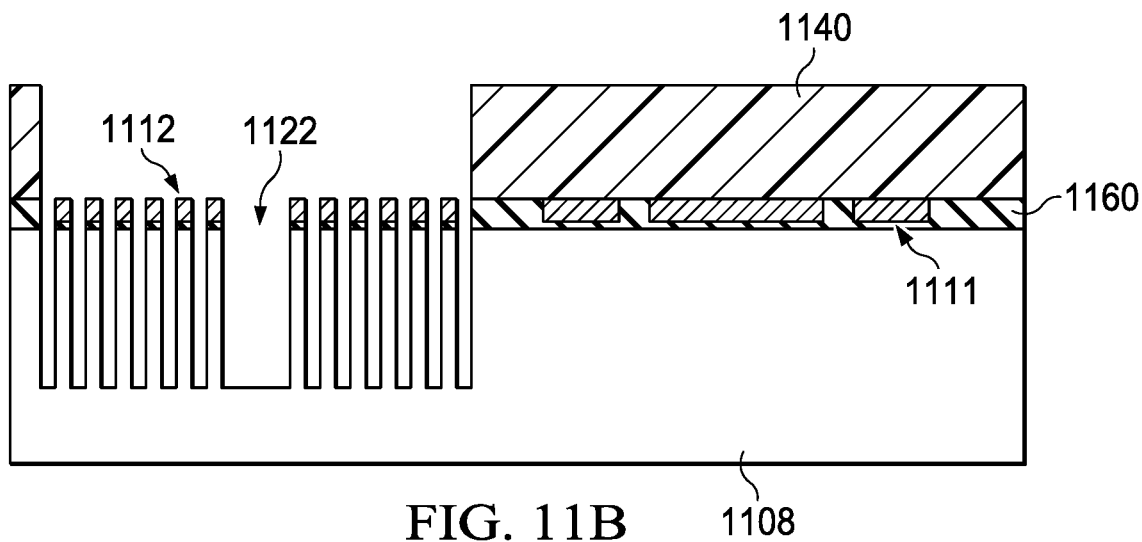
Figure 11C:
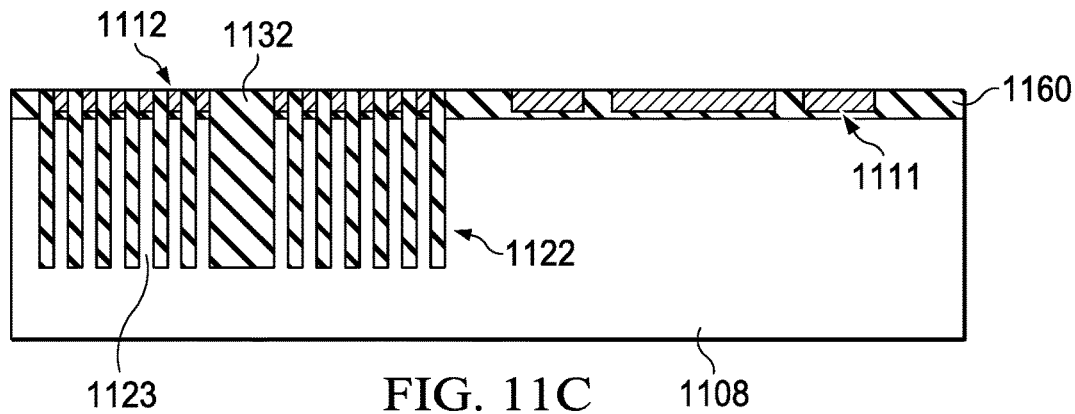
Figure 11D:
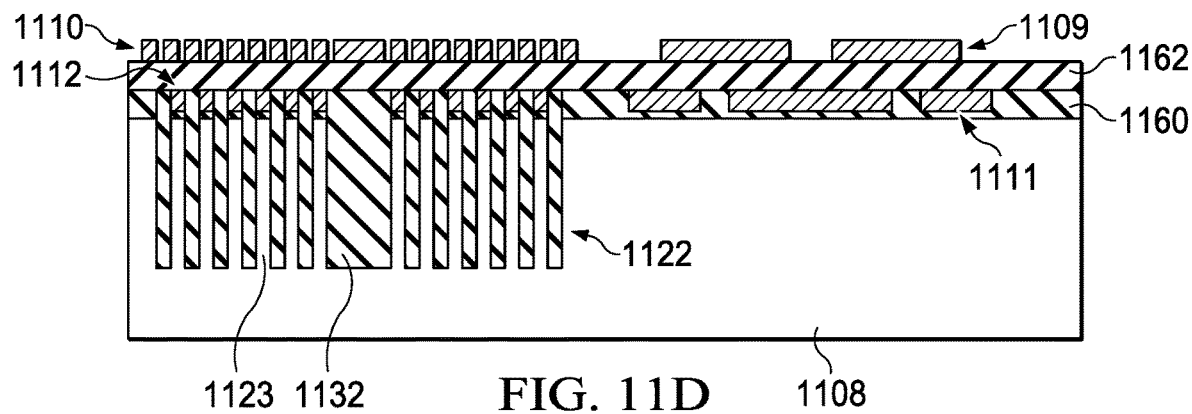
Figure 11E:
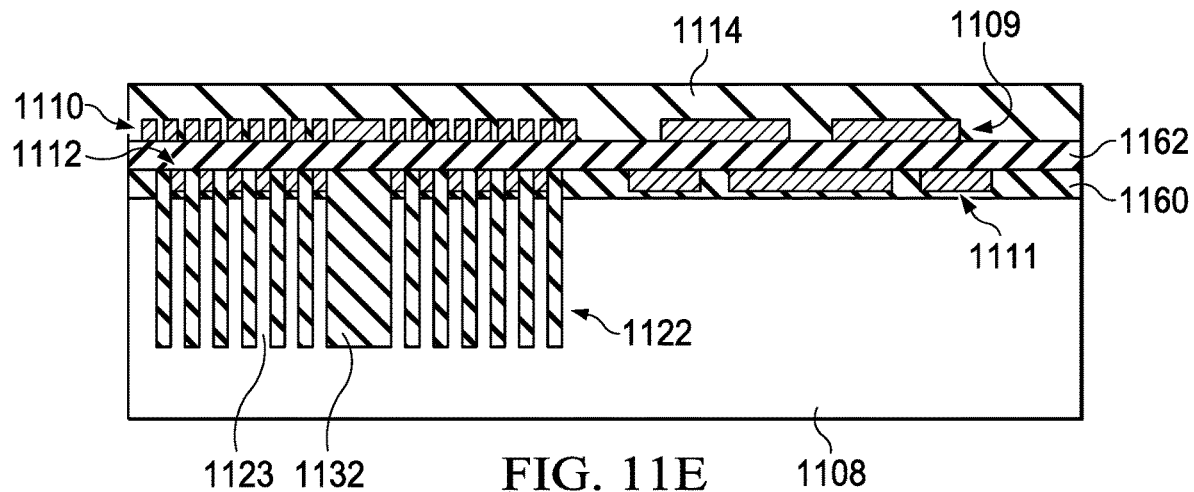

Step 1005 (illustrated in FIG. 11B) is to etch the trench 1122 vertically through the IMD layers in the coil spaces and through the dielectric layer isolating the first transformer coil 1112 from the semiconductor substrate 1108. FIG. 11B illustrates etching the trenches 1122 self-aligned to the first transformer coil 1112.

In step 1007 the trench 1122 is etched into the semiconductor substrate 1108. In some examples the depth of the trench 1122 is at least equal to the radius of the overlying first transformer coil 1112. Alternatively the trench 1122 may be etched to a depth that equals or exceeds the final thickness of the semiconductor substrate 1108 after a back grind operation. The depth may be between 150 um and 300 um. The pattern of the first transformer coil 1112 is transferred into the semiconductor substrate 1108 forming an additional inductor coil (substrate inductor coil) 1123 in the semiconductor substrate 1108.

In step 1009 the trench photo resist pattern 1140 is removed.

In step 1011 (illustrated in FIG. 11C) the trench 1122 is filled with a dielectric replacement material 1132. In one approach, droplets of a dielectric containing fluid (ink) fill the trench 1122 using a droplet dispensing apparatus similar to an inkjet apparatus. The dielectric containing fluid may include, for example, uncured epoxy, uncured polyimide, ceramic slurry, sol-gel, a siloxane-containing fluid or some other insulating material. Alternatively the dielectric replacement material ink may be a ferrite containing polymer fluid (ink). Other methods for forming the dielectric replacement material 1132 can be used to form additional alternative example arrangements.

In step 1013 the dielectric replacement material 1132 is annealed to drive off solvent from the dielectric containing fluid and to cure the dielectric replacement material 1132. The anneal can be performed at a temperature in the range of about 80° C. to 300° C. and at reduced atmospheric pressure to aid in the removal of bubbles or voids from the dielectric replacement material 1132.

In step 1015 (illustrated in FIG. 11D) a interconnect layer 1162 consisting of additional layers of interconnect (not shown) and IMD is added using conventional methods.

In step 1017 (illustrated in FIG. 11D) second transformer coil 1110 is formed vertically displaced from the first transformer coil 1112 and electrically isolated by one or more layers of IMD. The center of the second transformer coil 1110 is aligned with the center of the first transformer coil 1112. The second transformer coil 1110 can be formed simultaneously with the formation on an interconnect layer 1109. The second transformer coil 1110 using this method can have coil windings with a different width and space and with a different number of coil windings than the first transformer coil 1112. In an alternative approach, the second transformer coil 1110 can have the same number of coil windings, same width and same spacing as the first coil 1112.

In step 1019 (illustrated in FIG. 11E) and additional interconnect layer 1114 with additional layers of interconnect and IMD and possibly additional embedded inductor coils can be added to complete the integrated circuit 1105.

Figure 11F:
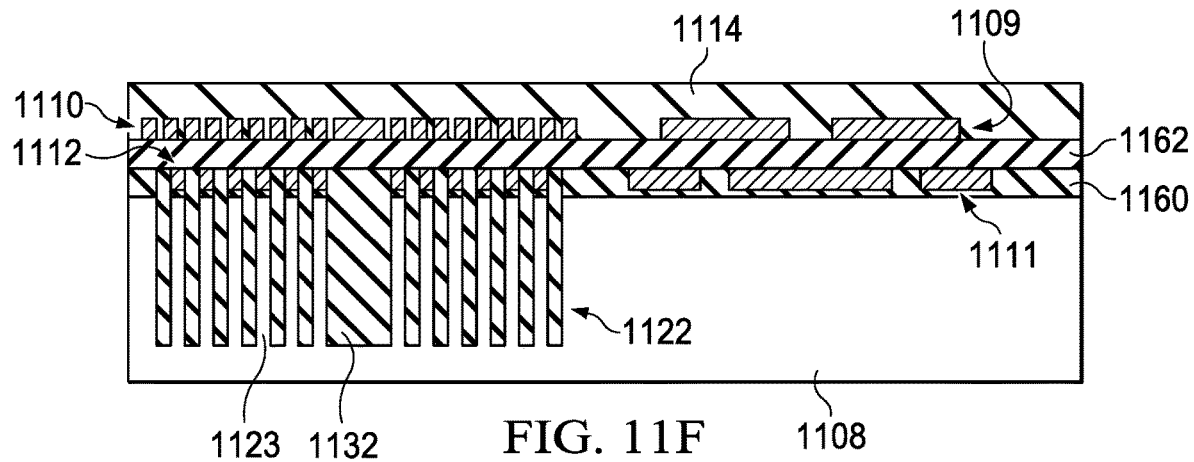
Figure 11G:
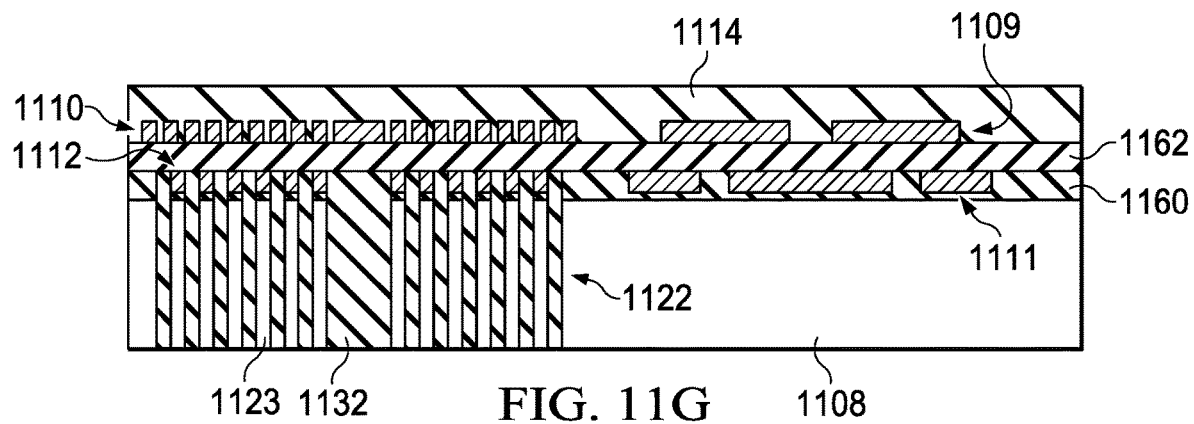

In step 1021 (illustrated in FIG. 11F) the second surface or backside surface of substrate 1108 is subjected to back grinding to reach a final target semiconductor substrate 1108 thickness. As is illustrated in FIG. 11F the trenches 1122 penetrate into the semiconductor substrate 1108 but do not penetrate completely through the semiconductor substrate 1108. In an example the depth of the trenches 1122 is at least equal to the radius of the embedded transformer coils 1110, 1112.

Alternatively, in step 1021 (illustrated in FIG. 11G) the semiconductor substrate 1108 of the integrated circuit 1105 is subjected to back grinding exposing the bottoms of the replacement dielectric 1132 filled trenches 1122. In this example arrangement, the trenches 1122 extend from the surface of the first transformer coil 1112 through the coil spaces in the first transformer coil 1112, through the dielectric layer isolating the first transformer coil 1110 from the semiconductor substrate 1108, and through the coil spaces of the substrate inductor coil 1123. In this alternative approach the second surface or backside surface of the semiconductor substrate 1108 is subjected to backgrinding until the trenches 1122 penetrate completely through the remaining thickness of semiconductor substrate 1108.

Modifications are possible in the described examples, and other alternative arrangements are possible within the scope of the claims.

What is claimed is:

1. A transformer, comprising:
    a first integrated circuit with at least one first embedded transformer coil with first coil windings and first coil spaces lying in a first plane oriented in a first direction and with a first trench oriented in a second direction at an angle to the first direction and filled with replacement dielectric, the first trench extending from a first surface of a first semiconductor substrate to a first depth in the first semiconductor substrate, the first semiconductor substrate having a second surface opposite the first surface;
    a second integrated circuit with at least one second embedded transformer coil with second coil windings and second coil spaces lying in a second plane oriented in the first direction and with a second trench oriented in the second direction at an angle to the first direction and filled with replacement dielectric, the second trench extending from a first surface of a second semiconductor substrate to a second depth in the second semiconductor substrate, the second semiconductor substrate having a second surface opposite the first surface of the second semiconductor substrate;

the second integrated circuit inverted and bonded to the first surface of the first integrated circuit using a dielectric bonding material;

a center of the second transformer coil aligned with a center of the first transformer coil;

a layer of magnetic core material surrounded by a dielectric bonded between the first integrated circuit and the second integrated circuit and disposed between the first transformer coil and the second transformer coil.

2. The transformer of claim 1 in which the first depth is greater than a radius of the first embedded transformer coil.

3. The transformer of claim 1, in which the first trench penetrates completely through the first semiconductor substrate and in which the second trench penetrates completely through the second semiconductor substrate.

4. The transformer of claim 1, in which the first integrated circuit includes a plurality of first trenches with a first coil longitudinal dimension orientated approximately perpendicular to a first winding longitudinal dimension of the first coil windings and in which the second integrated circuit includes a plurality of second trenches with a second coil longitudinal dimension oriented approximately perpendicular to a second winding longitudinal dimension of the second coil windings.

5. The transformer of claim 1, in which the first integrated circuit includes a first substrate inductor coil with first substrate coil spacings with a same size and number of coil windings as the first coil windings and in which the second integrated circuit includes a second substrate inductor coil with second substrate coil spacings with a same size and number of coil windings as the second coil windings.

6. The transformer of claim 1, further comprising:
a lead frame;
the first integrated circuit bonded to a die bond pad on the lead frame; and
a portion of the die bond pad underlying the first transformer coil replaced with a dielectric material.

7. The transformer of claim 1, wherein the second depth is greater than a radius of the second embedded transformer coil.

8. A transformer, comprising:
a first integrated circuit with at least one first embedded transformer coil with first coil windings and first coil spaces oriented in a first direction and with a first trench oriented in a second direction at an angle to the first direction, the first trench extending from a first surface of a first semiconductor substrate to a first depth in the first semiconductor substrate;

a second integrated circuit with at least one second embedded transformer coil with second coil windings and second coil spaces oriented in the first direction and with a second trench oriented in the second direction at an angle to the first direction, the second trench extending from a first surface of a second semiconductor substrate to a second depth in the second semiconductor substrate;

the second integrated circuit bonded to the first surface of the first integrated circuit;

a lead frame;

the first integrated circuit bonded to a die bond pad on the lead frame; and a portion of the die bond pad underlying the first transformer coil replaced with a dielectric material.

9. The transformer of claim 8, wherein the first trench and the second trench are filled with dielectric material.

10. The transformer of claim 8, wherein the first semiconductor substrate includes a second surface opposite the first surface.

11. The transformer of claim 10, wherein the first embedded transformer coil is proximate the first surface of the first semiconductor substrate than the second surface of the first semiconductor substrate.

12. The transformer of claim 8, wherein the second semiconductor substrate includes a second surface opposite the first surface of the second semiconductor substrate.

13. The transformer of claim 12, wherein the second embedded transformer coil is proximate the first surface of the second semiconductor substrate than the second surface of the second semiconductor substrate.

14. The transformer of claim 8, wherein the first coil windings and first coil spaces lie in a first plane, and the second coil windings and second coil spaces lie in a second plane.

15. The transformer of claim 8, wherein the second depth is greater than a radius of the second embedded transformer coil.

16. The transformer of claim 8, wherein the second integrated circuit is inverted and bonded to the first surface of the first integrated circuit using a dielectric bonding material.

17. The transformer of claim 8, wherein a center of the second transformer coil is aligned with a center of the first transformer coil.

* * * * *